US012694933B2

(12) United States Patent
Deng et al.

(10) Patent No.: US 12,694,933 B2
(45) Date of Patent: Jul. 28, 2026

(54) MEMORY DEVICES, AND OPERATION METHOD THEREOF, MEMORY SYSTEMS

(71) Applicant: YANGTZE MEMORY TECHNOLOGIES CO., LTD., Wuhan (CN)

(72) Inventors: JiaLiang Deng, Wuhan (CN); ZhuQin Duan, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 139 days.

(21) Appl. No.: 18/793,351

(22) Filed: Aug. 2, 2024

(65) Prior Publication Data

US 2025/0239308 A1 Jul. 24, 2025

(30) Foreign Application Priority Data

Jan. 18, 2024 (CN) .......................... 202410075480.1

(51) Int. Cl.
*G11C 16/10* (2006.01)
*G11C 16/20* (2006.01)
*G11C 16/26* (2006.01)

(52) U.S. Cl.
CPC ............ *G11C 16/102* (2013.01); *G11C 16/20* (2013.01); *G11C 16/26* (2013.01)

(58) Field of Classification Search
CPC ........ G11C 16/102; G11C 16/20; G11C 16/26
See application file for complete search history.

(56) References Cited

U.S. PATENT DOCUMENTS

| | | | |
|---|---|---|---|
| 2012/0117350 A1* | 5/2012 | Bates .................... | G06F 3/0634 |
| | | | 711/E12.002 |
| 2014/0006696 A1* | 1/2014 | Ramanujan ......... | G06F 12/0246 |
| | | | 711/103 |
| 2016/0259589 A1* | 9/2016 | Zettsu ................... | G06F 1/3287 |
| 2022/0164108 A1* | 5/2022 | Morgan ............... | G06F 3/0604 |

* cited by examiner

*Primary Examiner* — Min Huang
(74) *Attorney, Agent, or Firm* — Conley Rose, P.C.

(57) ABSTRACT

Examples of the present disclosure disclose a memory device and an operation method thereof, a memory system and an operation method thereof, and a storage medium. A memory cell of the memory device is programmed to a first memory state after a first program operation is performed, and data in the first memory state is programmed to a second memory state after a second program operation is performed. A peripheral circuit is configured to: in response to powering up again after a power down during a second program operation, determine the second memory state corresponding to the second program operation according to identification information and the data in the first memory state after the first program operation; and reperform the second program operation, such that the memory cell is programmed to the second memory state.

20 Claims, 14 Drawing Sheets

410(40)

Memory device — 32

Memory controller — 31

— 41

50

60

611

51

52

Read voltage

621

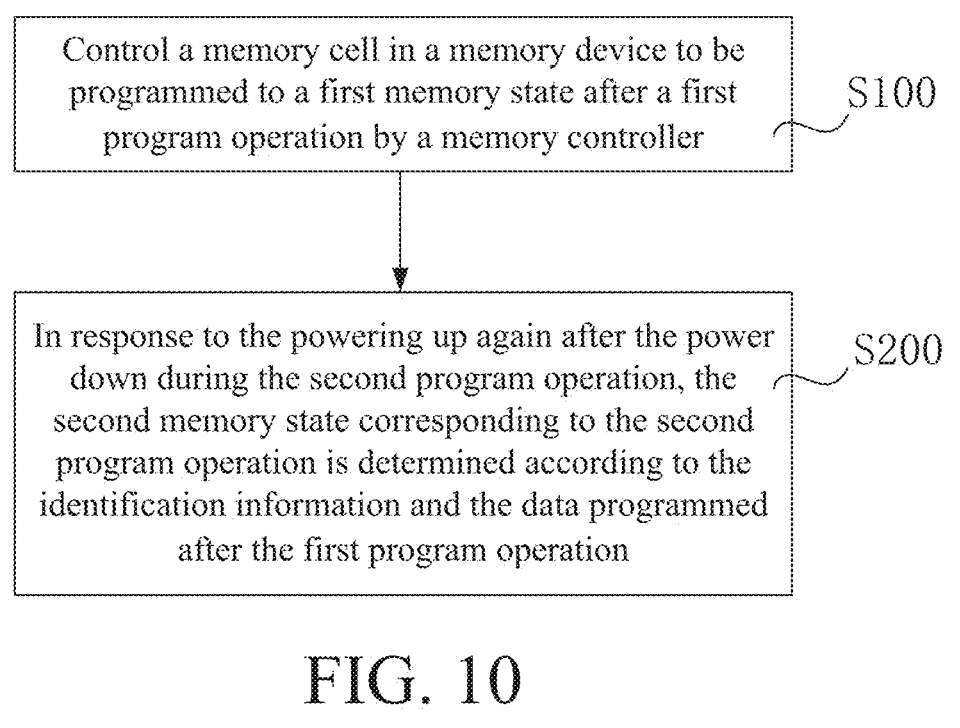

Control a memory cell in a memory device to be
programmed to a first memory state after a first
program operation by a memory controller — S100

In response to the powering up again after the power
down during the second program operation, the
second memory state corresponding to the second
program operation is determined according to the
identification information and the data programmed
after the first program operation — S200

FIG. 10

MEMORY DEVICES, AND OPERATION METHOD THEREOF, MEMORY SYSTEMS

CROSS-REFERENCE TO RELATED APPLICATIONS

This application claims the benefit of priority to China Patent Application No. CN 2024100754801, filed on Jan. 18, 2024, which is incorporated herein by reference in its entirety.

TECHNICAL FIELD

Examples of the present disclosure relate to the technical field of semiconductors, and relate to, but are not limited to, a memory device and an operation method thereof, a memory system and an operation method thereof, and a storage medium.

BACKGROUND

Semiconductor memories may be roughly divided into two categories, depending on whether they retain stored data in the case of a power down. Such two categories of semiconductor memories include: volatile memories and non-volatile memories. The volatile memories lose the stored data in the case of the power down, and the non-volatile memories retain the stored data in the case of the power down.

SUMMARY

According to one aspect of the present, a memory device is provided. The memory device may include an array of memory cells and a peripheral circuit. The array of memory cells may include a plurality of memory cells. Each of the memory cells is programmed to a first memory state after a first program operation is performed, data in the first memory state is programmed to a second memory state after a second program operation is performed, and distribution width of the threshold voltages of the first memory state is greater than that of the second memory state.

The peripheral circuit is coupled to the array of memory cells and configured to: in response to powering up again after a power down during the second program operation, determine the second memory state corresponding to the second program operation according to identification information and the data in the first memory state after the first program operation, wherein the identification information is to represent the second memory state corresponding to the second program operation; and reperform the second program operation, such that the memory cell is programmed to the second memory state.

In some examples, the peripheral circuit is configured to: generate the identification information for the second program operation that corresponds to the first memory state during the first program operation; and store the identification information.

In some examples, the array of memory cells comprise a plurality of memory blocks, and the peripheral circuit is configured to: store the identification information in a specified memory block among the plurality of memory blocks.

In some examples, a number of storage bits in the memory cell may include multiple bits, and the multiple storage bits correspond to a plurality of memory states. The peripheral circuit is configured to: generate the identification information sequentially according to a sequential order of the plurality of memory states.

In some examples, the number of storage bits in the memory cell may include M storage bits, the M storage bits correspond to $2^M$ memory states, the identification information may include N bits of data, and values of the identification information comprise $2^N$ data states; M and N are both positive integers.

The peripheral circuit is configured to: generate the $2^N$ data states corresponding to the values of the identification information sequentially and cyclically according to the sequential order of the $2^M$ memory states.

In some examples, the $2^M$ memory states of the memory cell comprise: $2^M$ first memory states after the first program operation being performed, wherein threshold voltage distributions of the first memory states are first threshold voltage distributions; and $2^M$ second memory states after the second program operation being performed that correspond to the first memory states, wherein threshold voltage distributions of the second memory states are second threshold voltage distributions. Each of the first threshold voltage distributions has a range wider than a range of a respective second threshold voltage distribution; ranges of adjacent ones of the plurality of first threshold voltage distributions overlap.

In some examples, the peripheral circuit is configured to: determine a target interval in which the memory cell is located after the first program operation with P-stage read voltages, wherein the P-stage read voltages divide the first to $(2^M)$th ones of the first threshold voltage distributions into P+1 intervals, each of the P+1 intervals may include a plurality of consecutive first threshold voltage distributions, the different first threshold voltage distributions in each interval correspond to different values of the identification information, and P is a positive integer; and reprogram the data in the first memory state in the second program operation according to a determined target interval and a value of the identification information, such that the memory cell is programmed to the second memory state.

In some examples, a numbers of the first threshold voltage distributions included in each interval are the same or different; and some of the first threshold voltage distributions have ranges spanning across both sides of one-stage read voltage.

In some examples, the P-stage read voltages comprise the first to Pth stage read voltages with gradually increasing voltage values; the P+1 intervals comprise the first to (P+1)th intervals. The peripheral circuit is configured to: perform a first read operation with the first stage read voltage, and determine the identification information and the interval in which the first memory state of the memory cell is located after the first program operation, perform the second program operation on the memory cell in the first memory state in the first interval, and determine the second memory state corresponding to the first memory state;

perform second to (P−1)th read operations with second to (P−1)th stage read voltages respectively, perform the second program operation on memory cells in the first memory states in the second to Pth intervals respectively according to the identification information and intervals in which the first memory states are located that are resulted from the second to (P−1)th read operations, and determine second memory states corresponding to the first memory states; and perform a Pth read operation with the Pth stage read voltage respectively, perform the second program operation on the memory cell in the first memory state in the (P+1)th interval according to the identification information and an interval in which the first memory state is located that is resulted from the Pth read operation, and determine the second memory state corresponding to the first memory state.

In some examples, the number of storage bits in the memory cell may include 4 storage bits, the 4 storage bits correspond to 16 memory states, and the values of the identification information comprise 4 data states.

The peripheral circuit is configured to: determine the target interval in which the first memory state of the memory cell after the first program operation is located with 6-stage read voltages, wherein a first stage read voltage is a median between the first and fourth ones of the first threshold voltage distributions, a second stage read voltage is a median between the third and sixth ones of the first threshold voltage distributions, a third stage read voltage is a median between the fifth and eighth ones of the first threshold voltage distributions, a fourth stage read voltage is a median between the seventh and tenth ones of the first threshold voltage distributions, a fifth stage read voltage is a median between the ninth and twelfth ones of the first threshold voltage distributions, and a sixth stage read voltage is a median between the eleventh and fourteenth ones of the first threshold voltage distributions, and if the target interval in which the first memory state after the first program operation is located is the first interval and a value of the identification information is a first data state in the 4 data states, the first memory state is located in a first one in the first threshold voltage distributions; and perform the second program operation on the memory cell, such that the first memory state located in a first one in the first threshold voltage distributions is programmed to the second memory state.

In some examples, the peripheral circuit may include a page buffer, the page buffer comprising a plurality of latches. The peripheral circuit is configured to: store the interval in which the first memory state is located that is resulted from each read operation in a first latch among the plurality of latches, and store the identification information in a second latch and a third latch among the plurality of latches; and store four bits of data in the first memory state to be programmed in the second program operation in fourth to seventh latches among the plurality of latches according to data in the first, second, and third latches.

In some examples, the array of memory cells may include a plurality of word lines, with one of the word lines being coupled with a plurality of memory cells.

The peripheral circuit is configured to: perform the first program operation and the second program operation sequentially on the memory cells coupled with the spaced word lines according to the sequence of physical locations of the plurality of word lines. For the plurality of memory cells coupled with the same word line, the second program operation is performed after the first program operation is performed.

In some examples, the plurality of word lines comprise a Qth word line, a (Q+1)th word line, a (Q+2)th word line, and a (Q+3)th word line of which physical locations are disposed consecutively. Q is a natural number.

The peripheral circuit is configured to: perform the first program operation on the memory cells coupled with the (Q+1)th word line; then perform the second program operation on the memory cells coupled with the Qth word line; then perform the first program operation on the memory cells coupled with the (Q+2)th word line; then perform the second program operation on the memory cells coupled with the (Q+1)th word line; then perform the first program operation on the memory cells coupled with the (Q+3)th word line; and then perform the second program operation on the memory cells coupled with the (Q+2)th word line.

After the peripheral circuit controls the memory device to perform the first program operation, the memory cell is programmed to the first memory state. The first memory state refers to the distribution width of the threshold voltages of the memory cell being a large range, and in the case of the abnormal power down of the memory device, a recovery of original data may not be implemented accurately according to the first memory state alone. Accordingly, the peripheral circuit makes the ranges of the threshold voltage distributions of the memory cell more accurate according to the identification information. The memory device employs the second program operation to determine the second memory state of the memory cell with the first memory state and the identification information. On that basis, in the case of the abnormal power down of the memory device, the memory device may acquire an original memory state of the memory cell with the identification information representing the second memory state and the first memory state. As such, after reprogramming being performed by the control of the peripheral circuit, data of the original memory state is recovered to acquire a memory state of the memory cell before the abnormal power down, increasing the accuracy of the data recovery, and thereby improving the performance of the memory device and the user experience.

According to another aspect of the present disclosure provide a method of operating a memory device. The operation method may include: in response to powering up again after a power down during a second program operation, determining a second memory state corresponding to the second program operation according to data in a first memory state after a first program operation and identification information, wherein the identification information is to represent the second memory state corresponding to the second program operation, a memory cell in the memory device is programmed to a first memory state after the first program operation is performed, and the data in the first memory state is programmed to the second memory state after the second program operation is performed; and reperforming the second program operation, such that the memory cell is programmed to the second memory state.

The beneficial effects of the above method of operating a memory device are the same as the beneficial effects of the memory device provided by any of the above examples, and are no longer repeated here.

According to a further aspect of the present disclosure provide a memory system. The memory system may include a memory device and a memory controller.

The memory device may include a plurality of memory cells. The memory cell is programmed to a first memory state after the first program operation is performed, and data in the first memory state is programmed to a second memory state after a second program operation is performed.

The memory controller is coupled with memory device and configured to: in response to powering up again after a power down during the second program operation, determine the second memory state corresponding to the second program operation according to identification information and the data in the first memory state after the first program operation, wherein the identification information is to represent the second memory state corresponding to the second program operation; and control the memory device to reperform the second program operation, such that the memory cell is programmed to the second memory state.

In some examples, the memory controller is configured to: send an instruction for generating before the first program operation, wherein the instruction for generating instructs the memory device to generate the identification information for the second memory state of the second program operation that corresponds to the first memory state during the first program operation; and after the first program operation, store the identification information fed back from the memory device.

In some examples, the memory system further may include a buffer, and the memory controller is configured to: store the identification information in the memory device; or store the identification information in the buffer, and during a power down latency after the power down, dump the identification information stored in the buffer into the memory device; and read the identification information in the memory device back into the buffer after the powering up again.

In some examples, the number of storage bits in the memory cell may include multiple bits, and the multiple storage bits correspond to a plurality of memory states. The memory controller is configured to: control the memory device to generate the identification information sequentially according to a sequential order of the plurality of memory states.

In some examples, the number of storage bits in the memory cell may include M storage bits, the M storage bits correspond to $2^M$ memory states, the identification information may include N bits of data, and values of the identification information comprise $2^N$ data states. M and N are both positive integers.

The memory controller is configured to: control the memory device to generate the $2^N$ data states corresponding to the values of the identification information sequentially and cyclically according to the sequential order of the $2^M$ memory states.

In some examples, the $2^M$ memory states of the memory cell comprise: $2^M$ first memory states after the first program operation being performed, wherein threshold voltage distributions of the first memory states are first threshold voltage distributions; and $2^M$ second memory states after the second program operation being performed that correspond to the first memory states, wherein threshold voltage distributions of the second memory states are second threshold voltage distributions. Each of the first threshold voltage distributions has a range wider than a range of a respective second threshold voltage distribution; ranges of adjacent ones of the plurality of first threshold voltage distributions overlap.

In some examples, the memory controller is configured to: determine a target interval in which the memory cell is located after the first program operation with P-stage read voltages, wherein the P-stage read voltages divide the first to $(2^M)$th ones of the first threshold voltage distributions into P+1 intervals, each of the P+1 intervals may include a plurality of consecutive first threshold voltage distributions, the different first threshold voltage distributions in each interval correspond to different values of the identification information, and P is a positive integer; and reprogram the data in the first memory state in the second program operation according to a determined target interval and a value of the identification information, such that the memory cell is programmed to the second memory state.

In some examples, the numbers of the first threshold voltage distributions included in each interval are the same or different; and some of the first threshold voltage distributions have ranges spanning across both sides of one stage read voltage.

In some examples, the P-stage read voltages comprise the first to Pth stage read voltages with gradually increasing voltage values; the P+1 intervals comprise the first to (P+1)th intervals.

The memory controller is configured to: perform a first read operation with the first stage read voltage, and determine the identification information and the interval in which the first memory state of the memory cell is located after the first program operation, perform the second program operation on the memory cell in the first memory state in the first interval, and determine the second memory state corresponding to the first memory state;

perform second to (P–1)th read operations with second to (P–1)th stage read voltages respectively, perform the second program operation on memory cells in the first memory states in the second to Pth intervals respectively according to the identification information and intervals in which the first memory states are located that are resulted from the second to (P–1)th read operations, and determine second memory states corresponding to the first memory states; and perform a Pth read operation with the Pth stage read voltage respectively, perform the second program operation on the memory cell in the first memory state in the (P+1)th interval according to the identification information and an interval in which the first memory state is located that is resulted from the Pth read operation, and determine the second memory state corresponding to the first memory state.

In some examples, the number of storage bits in the memory cell may include 4 storage bits, the 4 storage bits correspond to 16 memory states, and the values of the identification information comprise 4 data states.

The memory controller is configured to: determine the target interval in which the first memory state of the memory cell after the first program operation is located with 6-stage read voltages, wherein a first stage read voltage is a median between the first and fourth ones of the first threshold voltage distributions, a second stage read voltage is a median between the third and sixth ones of the first threshold voltage distributions, a third stage read voltage is a median between the fifth and eighth ones of the first threshold voltage distributions, a fourth stage read voltage is a median between the seventh and tenth ones of the first threshold voltage distributions, a fifth stage read voltage is a median between the ninth and twelfth ones of the first threshold voltage distributions, and a sixth stage read voltage is a median between the eleventh and fourteenth ones of the first threshold voltage distributions, and if the target interval in which the first memory state after the first program operation is located is the first interval and a value of the identification information is a first data state in the 4 data states, the first memory state is located in a first one in the first threshold voltage distributions; and perform the second program operation on the memory cell, such that the first memory state located in a first one in the first threshold voltage distributions is programmed to the second memory state.

In some examples, the memory device further may include a peripheral circuit, the peripheral circuit comprising a page buffer, and the page buffer comprising a plurality of latches.

The memory controller is configured to: store the interval in which the first memory state is located that is resulted from each read operation in a first latch among the plurality of latches, and store the identification information in a second latch and a third latch among the plurality of latches; and store four bits of data in the first memory state to be programmed in the second program operation in fourth to seventh latches among the plurality of latches according to data in the first, second, and third latches.

In some examples, the memory device may include a plurality of word lines, with one of the word lines being coupled with a plurality of memory cells.

The memory controller is configured to: control the memory device to perform the first program operation and the second program operation sequentially on the spaced word lines according to the sequence of physical locations of the plurality of word lines. For the plurality of memory cells coupled with the same word line, the second program operation is performed after the first program operation is performed.

In some examples, the plurality of word lines comprise a Qth word line, a (Q+1)th word line, a (Q+2)th word line, and a (Q+3)th word line of which physical locations are disposed consecutively; Q is a natural number.

The memory controller is configured to: control the memory device to perform the first program operation on the memory cells coupled with the (Q+1)th word line; then perform the second program operation on the memory cells coupled with the Qth word line; then perform the first program operation on the memory cells coupled with the (Q+2)th word line; then perform the second program operation on the memory cells coupled with the (Q+1)th word line; then perform the first program operation on the memory cells coupled with the (Q+3)th word line; and then perform the second program operation on the memory cells coupled with the (Q+2)th word line.

The memory cell in the memory system is programmed to the first memory state after the first program operation is performed under the control of the memory controller. The first memory state refers to the distribution width of the threshold voltages of the memory cell being a large range, and a recovery of original data may not be implemented accurately according to the first memory state alone. Accordingly, the memory controller makes the range of the threshold voltage distribution of the memory cell more accurate according to the identification information. The memory device employs the second program operation to determine the second memory state of the memory cell with the first memory state and the identification information. Original data of the memory cell prior to the power down is acquired, increasing the accuracy of the data recovery, and thereby improving the performance of the memory device and the user experience.

According to a further aspect of the present disclosure further provide a method of operating a memory system. The operation method may include: in response to powering up again after a power down during a second program operation, determining a second memory state corresponding to data programmed after a first program operation and identification information, wherein the identification information is to represent the second memory state corresponding to the second program operation, a memory cell in a memory device of the memory system is programmed to a first memory state after the first program operation is performed, and the data in the first memory state is programmed to the second memory state after the second program operation is performed; and controlling the memory device to reperform the second program operation, such that the memory cell is programmed to the second memory state.

The beneficial effects of the above method of operating a memory system are the same as the beneficial effects of the memory system provided by any of the above examples, and are no longer repeated here.

According to a further aspect of the present disclosure provide a storage medium having executable instructions stored thereon, wherein the executable instructions, when executed, may implement operations of the method of operating a memory device provided by any of the examples of the above second aspect or the method of operating a memory system provided by any of the examples of the above fourth aspect.

The beneficial effects of the storage medium provided by the examples are the same as the beneficial effects of the method of operating a memory device provided by any of the examples of the above second aspect or the method of operating a memory system provided by any of the examples of the above fourth aspect, and are no longer repeated here.

BRIEF DESCRIPTION OF THE DRAWINGS

In the drawings, like reference numerals may describe like components in different views. Like reference numerals having different letter suffixes may represent different examples of like components. The accompanying drawings illustrate generally, by way of example, but not by way of limitation, various examples as discussed herein.

FIG. 10 is a flow diagram of a method of operating a memory system provided by examples of the present disclosure;

DETAILED DESCRIPTION

Figure 1:
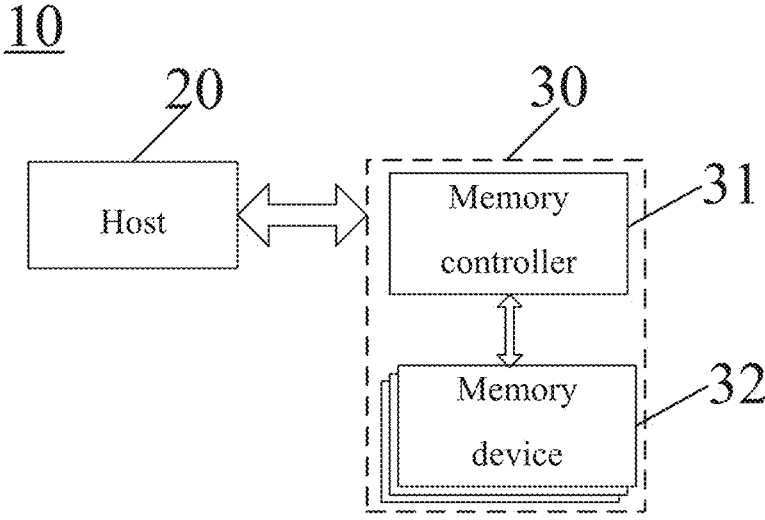
FIG. 1 is a schematic structural diagram of an electronic system provided by an example of the present disclosure.

In order to facilitate the understanding of the present disclosure, the present disclosure will be described below more comprehensively with reference to the relevant drawings. Examples of the present disclosure are given in the drawings. However, the present disclosure may be implemented in many different forms, and is not limited to the examples described herein. Instead, the purpose of providing these examples is to make the disclosure of the present disclosure more thorough and comprehensive.

Unless otherwise defined, all technical and scientific terms used herein have the same meanings as those generally understood by a person skilled in the art. The terms used in the specification of the present disclosure are only for the purpose of describing specific examples, and are not intended to limit the present disclosure. The term "and/or" used herein comprise any and all combinations of one or more listed associated items.

The phrases "first", "second", and the like used in the present disclosure do not indicate any stage, quantity, or importance, but are used only for distinguishing between different constituent parts. Similarly, the phrases "one", "a", "the", and the like do not indicate a quantitative limitation, but rather the existence of at least one. The phrases "include", "comprise", and the like mean that elements or items appearing in front of the phrases cover elements or items listed after the phrases and equivalents thereof, but do not exclude other elements or items. The phrases "connecting", "connected", "coupling" and the like are not limited to physical or mechanical coupling, but may comprise electrical coupling, whether direct or indirect.

It is to be understood that, references to "one example" or "an example" throughout this specification mean that particular features, structures, or characteristics related to the example are comprised in at least one example of the present disclosure. Therefore, "in one example" or "in an example" presented everywhere throughout this specification does not necessarily refer to the same example. Furthermore, these particular features, structures, or characteristics may be incorporated in one or more examples in any suitable manner. It is to be understood that, in various examples of the present disclosure, sequence numbers of the above processes do not indicate an execution sequence, and an execution sequence of various processes shall be determined by functionalities and intrinsic logics thereof, and shall constitute no limitation on an implementation process of the examples of the present disclosure. The above sequence numbers of the examples of the present disclosure are only for description, and do not represent advantages or disadvantages of the examples.

It is to be noted that, the terms "include", "comprise" or any variants thereof herein are intended to cover non-exclusive inclusion, such that a process, a method, an article or a device comprising a series of elements comprise not only those elements, but also other elements not listed explicitly, or elements inherent to this process, method, article or device. An element defined by a statement "comprising one" do not preclude the presence of another identical element in the process, method, article or device comprising this element, without more limitations.

In order to understand the present disclosure thoroughly, detailed operations and detailed structures will be proposed in the following description to set forth the technical solution of the present disclosure. The detailed descriptions of the preferable examples of the present disclosure are as follows. However, the present disclosure may also comprise other implementations in addition to these detailed descriptions.

Currently, a memory comprising memory cells of a multi-level cell type performs data storage using a 2-time program pattern. In an example, the data storage is performed in a pattern where coarse program is performed on the memory cells first and then fine program is performed. That is, the effect of the data storage is achieved only after a fine program operation is completed. A coarse program operation and the fine program operation are performed on different memory pages at the same time, with a particular time difference therebetween.

As such, in the case of an abnormal power down of the memory where data backup and recovery is performed through only error checking and correction employed in some examples, if there is a large amount of data on which no coarse program operation is performed, the power down of the memory is accelerated, affecting the effect of the data backup. In addition, for data in the memory on which the coarse program operation is performed but no fine program operation is performed, part of the data on which only the coarse program operation is performed may be lost, and corresponding recovered data may not be obtained, deteriorating user experience.

It is to be noted that data program operations comprise the coarse program operation and the fine program operation. The coarse program operation may result in a coarse threshold voltage distribution. The fine program operation may finely narrow the threshold voltage distribution resulting from the coarse program operation.

In view of above, as shown in FIG. 1, examples of the present disclosure provide an electronic system 10. In an example, the electronic system 10 may include, but is not limited to, a mobile phone, a desktop computer, a laptop computer, a tablet computer, a vehicle computer, a gaming console, a printer, a positioning apparatus, a wearable electronic apparatus, a smart sensor, a Virtual Reality (VR) apparatus, an Augmented Reality (AR) apparatus, or any other suitable electronic apparatuses having memory devices 32 therein.

With continued reference to FIG. 1, the electronic system 10 may comprise a host 20 and a memory system 30.

The host 20 may be a processor (e.g., a Central Processing Unit (CPU)) or a System on a Chip (SoC) (e.g., an Application Processor (AP)) of an electronic apparatus. The host 20 may be configured to send data to the memory system 30 or receive data from the memory system 30.

The memory system 30 may include a memory controller 31 and one or more memory devices 32, as well as other integrated circuitries for signal transmission. The memory controller 31 and one or more memory devices 32 may be integrated and packaged in the same storage medium 40 (referring to FIGS. 2 and 3). This facilitates the application of the memory system 30 to different types of end electronic products.

In an example, types of the storage medium 40 in which the memory controller 31 and one or more memory devices 32 are integrated include other types of memory apparatuses such as a Universal Flash Storage (UFS) or an Embedded Multi Media Card (eMMC).

Figure 2:
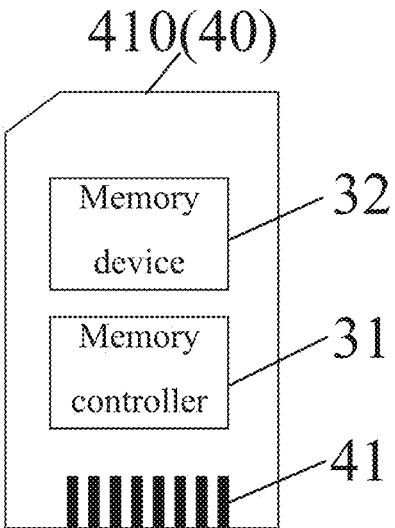
FIG. 2 is a schematic structural diagram of a storage medium provided by an example of the present disclosure.
Figure 3:
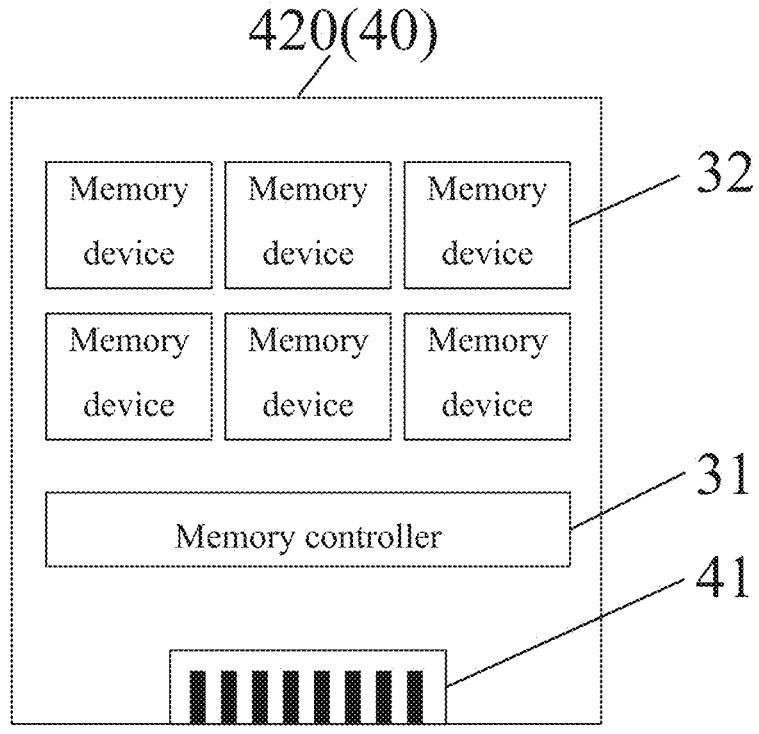
FIG. 3 is a schematic structural diagram of another storage medium provided by an example of the present disclosure.

There are various patterns of integrated circuits of the storage medium 40, e.g., a memory card 410 (as shown in FIG. 2) formed by integrating a single memory device 32 and the memory controller 31 together, or an SSD 420 (as shown in FIG. 3) formed by integrating a plurality of memory devices 32 and the memory controller 31 together.

In an example, the memory card 410 may include one or more types of memory apparatuses selected from a Personal Computer Memory Card International Association (PC) card, a CF card, a Smart Media (SM) card, a memory stick, a Multi-Media Card (MMC, Reduced-Size MMC (RS-MMC), and MMCmicro), an SD card (SD, miniSD, microSD, Secure Digital High Capacity (SDHC)), and a UFS, etc.

With continued reference to FIG. 2, the memory card 410 further may include a memory card connector 41. The memory card connector 41 is configured to couple the memory card 410 with a host (e.g., the host 20 in FIG. 1). For example, the memory card connector 41 include a gold finger.

Alternatively, with continued reference to FIG. 3, the SSD 420 further may include an SSD connector 41. The SSD connector 41 is configured to couple the SSD 420 with a host (e.g., the host 20 in FIG. 1). For example, the SSD connector 41 include a gold finger.

It may be understood that a storage capacity and/or an operation speed of the SSD 420 are greater than a storage capacity and/or an operation speed of the memory card 410.

The memory controller 31 and the memory device 32 (the host 20) integrated in the same memory apparatus are coupled with each other, and the memory controller 31 is configured to control the memory device 32.

In an example, the memory controller 31 may be designed for operating in a low duty-cycle environment, e.g., operating in a Secure Digital (SD) card, a Compact Flash (CF) card, or a Universal Serial Bus (USB) flash drive, or operating in other media for use in electronic apparatuses such as a personal computer, a digital camera, and a mobile phone, etc. In a further example, the memory controller 31 may be designed for operating in a high duty-cycle environment, e.g., operating in an embedded Multi-Media Card (eMMC). The SSD or eMMC may be used as a data memory for a mobile apparatus, such as a smartphone, a tablet computer, or a laptop computer, etc., or an enterprise memory array.

Further, the memory controller 31 can manage data in the memory device 32 and communicate with the host 20. The memory controller 31 may be configured to control read, erase and program operations of the memory device 32, may be further configured to manage various functions with respect to data stored or to be stored in the memory device 32, comprising, but not limited to, bad-block management, garbage collection, logical-to-physical address conversion, and wear leveling, etc., and may be further configured to process Error Checking and Correction (ECC) with respect to data read from the memory device 32 or written to the memory device 32.

Furthermore, the memory controller 31 may further perform any other suitable functions as well, e.g., formatting the memory device 32 or communicating with an external apparatus (e.g., the host 20 in FIG. 1) according to a particular communication protocol. For example, the memory controller 31 may communicate with the host 20 through at least one of various interface protocols. The interface protocols include one or more of a USB protocol, an MMC protocol, a Peripheral Component Interconnect (PCI) protocol, a Peripheral Component Interconnect Express (PCI-E) protocol, an Advanced Technology Attachment (ATA) protocol, a serial ATA protocol, a parallel ATA protocol, a Small Computer System Interface (SCSI) protocol, an Enhanced Small Drive Interface (ESDI) protocol, an Integrated Development Equipment (IDE) protocol, and a Firewire protocol, etc.

The memory device 32 may include, but is not limited to, one or more of a NAND Flash Memory, a Vertical NAND Flash Memory, a NOR Flash Memory, a Dynamic Random Access Memory (DRAM), a Ferroelectric Random Access Memory (FRAM), a Magnetoresistive Random Access Memory (MRAM), a Phase Change Random Access Memory (PCRAM), a Resistive Random Access Memory (RRAM), and a Nano Random Access Memory (NRAM), etc.

Based on the above illustration, the present disclosure provides illustration for subsequent examples through an example where the memory device 32 is a semiconductor memory, e.g., a solid-state electronic device (such as a NAND memory) for storing data information that is fabricated by a semiconductor integrated circuit process. The subsequent examples of the present disclosure do not limit the particular internal structures of the memory device 32 and the memory controller 31.

It may be understood that, In order to facilitate distinguishing between the cases of adaptive adjustments made by the memory device 32 and the memory controller 31 applied to different memory systems 30, for example, based on various structures of the memory device 32 illustrated in the above content, and logic for generating a control instruction outputted to the memory device 32 by the memory controller 31, the memory device (e.g., a NAND memory) provided in the subsequent examples of the present disclosure is illustrated by applying a memory device 60 applied to a memory system 50.

In order to solve the above problems, in some examples, as shown in FIGS. 4-9, the examples of the present disclosure provide the memory system 50.

Figure 4:
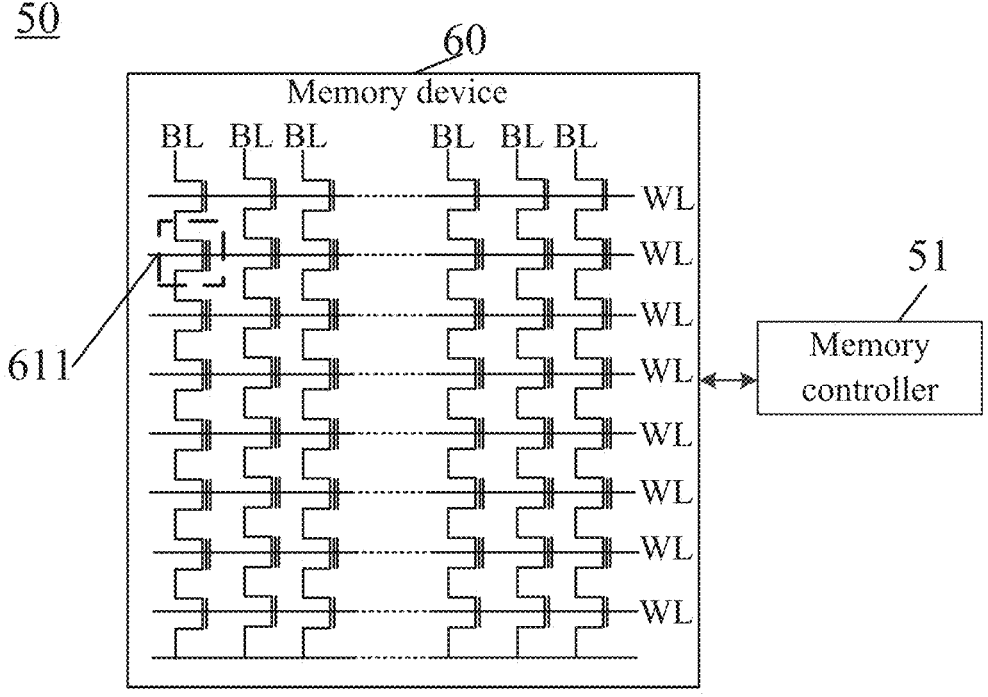
FIG. 4 is a schematic structural diagram I of a memory system provided by an example of the present disclosure.

As shown in FIG. 4, the memory system 50 may include the memory device 60 and a memory controller 51.

The memory device 60 may include a plurality of memory cells 611. The memory cells 611 is programmed to a first memory state after a first program operation is performed, and data in the first memory state is programmed to a second memory state after a second program operation is performed.

The memory controller 51 is coupled with the memory device 60 and configured to: in response to powering up again after a power down during a second program operation, determine the second memory state corresponding to the second program operation according to identification information and the data in the first memory state after the first program operation, wherein the identification information is to represent the second memory state corresponding to the second program operation; and control the memory device 60 to reperform the second program operation, such that the memory cell 611 is programmed to the second memory state.

In an example, the first program operation includes the coarse program operation, and the second program operation includes the fine program operation.

The memory cell 611 in the above memory system 60 is programmed to the first memory state after the first program operation is performed under the control of the memory controller 51. The first memory state refers to the distribution width of the threshold voltages of the memory cell 611 being a large range, and a recovery of original data may not be implemented accurately according to the first memory state alone. Accordingly, the memory controller 51 makes the range of the threshold voltage distribution of the memory cell 611 more accurate according to the identification information. The memory device 60 employs the second program operation to determine the second memory state of the memory cell 611 with the first memory state and the identification information. On that basis, in the case of the abnormal power down of the memory device 60, the memory device 60 may acquire an original memory state of the memory cell 611 with the memory cell 611 in the second memory state, in turn implement the recovery of the data by reprogramming the original memory state, and thereby acquire a memory state of the memory cell 611 before the abnormal power down.

It can be seen that, compared with data in the memory state of the memory cell 611 determined with the first memory state alone, the data determined in the examples of the present disclosure with the second memory state acquired from the first memory state and the identification information is more accurate, allowing the recovery of the original data of the memory cell 611 that is not stored during the power down, thereby improving the performance of the memory device 60 and the user experience.

In some examples, the memory controller 51 is configured to: send an instruction for generating before the first program operation, wherein the instruction for generating instructs the memory device 60 to generate the identification information for the second memory state of the second program operation that corresponds to the first memory state during the first program operation; and after the first program operation is performed, store the identification information fed back from the memory device 60.

It may be understood that the "first memory state", the "second memory state", and the "identification information" are in one-to-one correspondence, and the correspondence is pre-set (similar to a mapping table). The "identification information" corresponding to the "first memory state" that may represent the second memory state is filtered through the "instruction for generating".

As such, before the first program operation, the memory controller 51 sends the instruction for generating to control the memory device 60 to generate the identification information corresponding to the first memory state during the first program operation, and to store the identification information for subsequent use by the second program operation.

In some examples, as shown in FIG. 4, the memory device 60 may include a plurality of word lines WLs, with one word line WL being coupled with a plurality of memory cells 611.

The memory controller 51 is configured to: control the memory device 60 to perform the first program operation and the second program operation sequentially on the spaced word lines WLs according to the sequence of physical locations of the plurality of word lines WLs. For the plurality of memory cells 611 coupled with the same word line WL, the second program operation is performed after the first program operation is performed.

In an example, with continued reference to FIG. 4, the plurality of word lines WLs comprise a Qth word line WL, a (Q+1)th word line WL, a (Q+2)th word line WL, and a (Q+3)th word line WL of which physical locations are disposed consecutively. Q is a natural number.

The memory controller 51 is configured to: control the memory device 60 to perform the first program operation on the memory cells 611 coupled with the (Q+1)th word line WL; then perform the second program operation on the memory cells 611 coupled with the Qth word line WL; then perform the first program operation on the memory cells 611 coupled with the (Q+2)th word line WL; then perform the second program operation on the memory cells 611 coupled with the (Q+1)th word line WL; then perform the first program operation on the memory cells 611 coupled with the (Q+3)th word line WL; and then perform the second program operation on the memory cells 611 coupled with the (Q+2)th word line WL.

Figure 5:
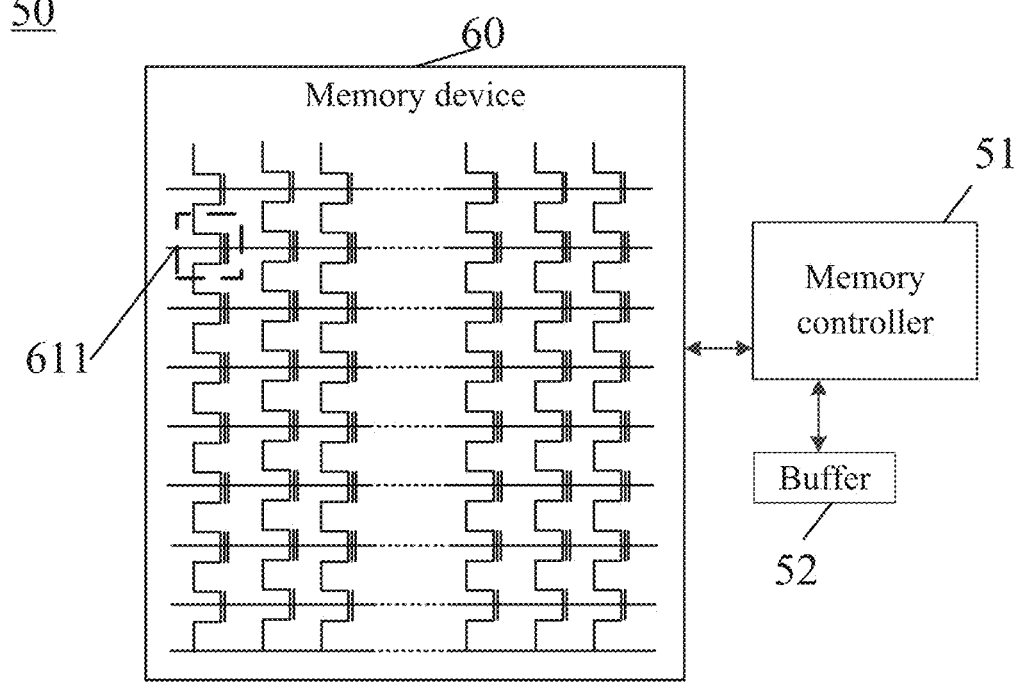
FIG. 5 is a schematic structural diagram II of a memory system provided by an example of the present disclosure.

As shown in FIG. 5, in some examples, the memory system 50 further may include a buffer 52. The buffer 52 is configured to store data temporarily.

The memory controller 51 is configured to: store the identification information in the memory device 60; or store the identification information in the buffer 52, and during a power down latency after the power down, dump the identification information stored in the buffer 52 into the memory device 60; and read the identification information in the memory device 60 back into the buffer 52 after the powering up again.

As such, the identification information may be stored in a buffer circuitry in the memory device 60 or may be present in the buffer 52 in the memory system 50, and the transmission of the information may be performed by the memory controller 51, which may be set according to the actual needs, thereby improving the range of applying the memory device 60 and the memory system 50.

Based on the correspondence of the "first memory state", the "second memory state", and the "identification information" mentioned above, a "identification information" is related to a memory state of the memory cell 611. Methods of determining the "identification information" and the "second memory state" are illustrated below through examples.

In some examples, a number of storage bits in the memory cell 611 may include multiple bits, and the multiple storage bits correspond to a plurality of memory states.

The memory controller 51 is configured to: control the memory device 60 to generate the identification information sequentially according to a sequential order of the plurality of memory states.

In an example, the number of the storage bits in the memory cell 611 is related to a memory type. The memory type of the memory cell 611 includes any one of a Single Level Cell (SLC), a Multi Level Cell (MLC), a Triple Level Cell (TLC), and a Quad Level Cell (QLC).

For example, the memory type of the memory cell 611 is the Multi Level Cell (MLC), with 2 storage bits and 22 memory states. For example, there are 4 memory states, including "00", "01", "10", and "11". The memory controller 51 controls the memory device 60 to generate the identification information according to a sequential order of the 4 memory states. For example, identification information "0" corresponds to the memory state "00", identification information "1" corresponds to the memory state "01", identification information "2" corresponds to the memory state "10", and identification information "3" corresponds to the memory state "11".

In some examples, the number of storage bits in the memory cell 611 may include M storage bits, the M storage bits correspond to $2^M$ memory states, the identification information May include N bits of data, and values of the identification information comprise $2^N$ data states. M and N are both positive integers.

The memory controller 51 is configured to: control the memory device 60 to generate the $2^N$ data states corresponding to the values of the identification information sequentially and cyclically according to the sequential order of the $2^M$ memory states.

Figure 6:
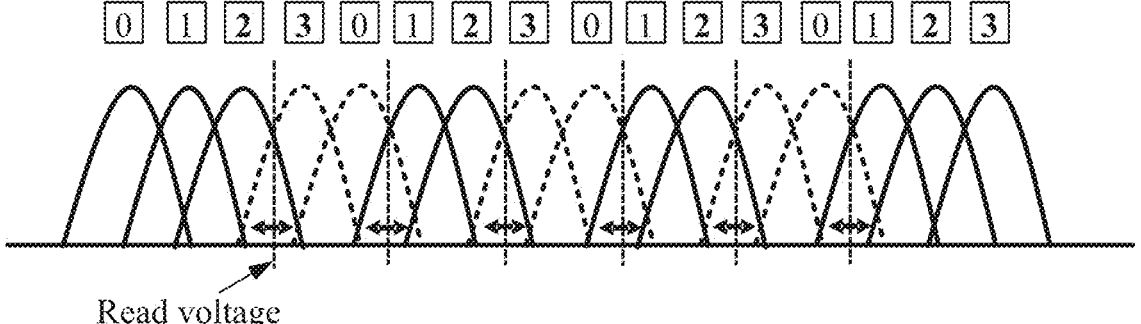
FIG. 6 is a schematic diagram of a threshold voltage distribution of a memory cell provided by an example of the present disclosure.

In an example, as shown in FIG. 6, the memory type of the memory cell 611 is the QLC, with 4 storage bits and 24 memory states. For example, there are 16 memory states, including "1111", "1110", "0110", "0010", "0011", "0001", "0000", "0100", "1100", "1000", "1010", "1011", "1001", "1101", "0101", and "0111". The memory controller 51 controls the memory device 60 to generate the identification information sequentially and cyclically according to a sequential order of the 16 memory states. For example, a data state of identification information corresponding to the memory state "1111" is "0", a data state of identification information corresponding to the memory state "1110" is "1", a data state of identification information corresponding to the memory state "0110" is "2", and a data state of identification information corresponding to the memory state "0010" is "3"; a data state of identification information corresponding to the memory state "0011" is "0", a data state of identification information corresponding to the memory state "0001" is "1", a data state of identification information corresponding to the memory state "0000" is "2", and a data state of identification information corresponding to the memory state "0100" is "3"; a data state of identification information corresponding to the memory state "1100" is "0", a data state of identification information corresponding to the memory state "1000" is "1", a data state of identification cation information corresponding to the memory state "1010" is "2", and a data state of identification information corresponding to the memory state "1011" is "3"; a data state of identification information corresponding to the memory state "1001" is "0", a data state of identification information corresponding to the memory state "1101" is "1", a data state of identification information corresponding to the memory state "0101" is "2", and a data state of identification information corresponding to the memory state "0111" is "3".

The $2^M$ memory states of the memory cell 611 comprise: $2^M$ first memory states after the first program operation being performed, wherein threshold voltage distributions of the first memory states are first threshold voltage distributions; and $2^M$ second memory states after the second program operation being performed that correspond to the first memory states, wherein threshold voltage distributions of the second memory states are second threshold voltage distributions.

Each of the first threshold voltage distributions has a range wider than a range of a respective second threshold voltage distribution. Ranges of adjacent ones of the plurality of first threshold voltage distributions overlap.

That is, a recovery of original data of the memory cell 611 may not be implemented accurately according to the first memory state alone. The memory device 60 employs the second program operation to determine the second memory state of the memory cell 611 with the first memory state and the identification information. On that basis, in the case of the abnormal power down of the memory device 60, the memory device 60 may acquire an original memory state of the memory cell 611 with the memory cell in the second memory state, in turn implement the data recovery by reprogramming the original memory state, and thereby acquiring a memory state of the memory cell 611 before the abnormal power down.

It is to be noted that the identification information may include N bits of data, and the value of N is related to a number of intervals into which the threshold voltage distributions of the memory cells 611 are divided, so as to avoid the presence of identification information for the same value in the same interval, in which case a threshold voltage range of the second memory state corresponding to the first memory state may not be determined according to the identification information.

For example, if two or more adjacent ones of threshold voltage distributions overlap, at least two threshold voltage distributions that meet a condition may be read using the same read voltage value, in which case a threshold voltage range in which a memory state of the current memory cell 611 is located may not be determined during the subsequent recovery of data. On that basis, N bits of identification information are required to distinguish between the threshold voltage distributions having an overlap range, so as to increase the accuracy of the data recovery.

In some examples, the memory controller 51 is configured to: determine a target interval in which the memory cell is located after the first program operation with P-stage read voltages, wherein the P-stage read voltages divide the first to $(2^M)$th ones of the first threshold voltage distributions into P+1 intervals, each of the P+1 intervals may include a plurality of consecutive first threshold voltage distributions, the different first threshold voltage distributions in each interval correspond to different values of the identification information, and P is a positive integer; and reprogram the data in the first memory state in the second program operation according to a determined target interval and a value of the identification information, such that the memory cell 611 is programmed to the second memory state.

The P-stage read voltages comprise the first to Pth stage read voltages with gradually increasing voltage values. The P+1 intervals comprise the first to (P+1)th intervals.

It may be understood that the P-stage read voltages may realize that the threshold voltage distributions in one interval correspond to different identification information. As such, after the target interval in which the first memory state of the memory cell 611 for currently reading is located is determined, the second memory state can be determined directly according to the identification information, improving the efficiency and accuracy of the second program operation and increasing the accuracy of the data recovery.

In an example, as shown in FIG. 6, the memory type of the memory cell 611 is the QLC, which may include the 16 memory states. P is 6, and the 6-stage read voltages divide the 16 first threshold voltage distributions into 7 intervals. The values of the 6-stage read voltages are determined based on values of the first threshold voltage distributions in an ascending order. For example, the first threshold voltage distribution corresponds to an erase state of the memory cell 611, values of the second one in the first threshold voltage distributions to the fourth one in the first threshold voltage distributions determine a first stage read voltage, values of the third one in the first threshold voltage distributions to the sixth one in the first threshold voltage distributions determine a second stage read voltage, values of the fifth one in the first threshold voltage distributions to the eighth one in the first threshold voltage distributions determine a third stage read voltage, values of the seventh one in the first threshold voltage distributions to the tenth one in the first threshold voltage distributions determine a fourth stage read voltage, values of the ninth one in the first threshold voltage distributions to the twelfth one in the first threshold voltage distributions determine a fifth stage read voltage, and values of the eleventh one in the first threshold voltage distributions to the fourteenth one in the first threshold voltage distributions determine a sixth stage read voltage.

The memory controller 51 is configured to: perform a first read operation with the first stage read voltage, and determine the identification information and the interval in which the first memory state of the memory cell 611 is located after the first program operation, perform the second program operation on the memory cell 611 in the first memory state in the first interval, and determine the second memory state corresponding to the first memory state;

perform second to (P−1)th read operations with second to (P−1)th stage read voltages respectively, perform the second program operation on memory cells in the first memory states in the second to Pth intervals respectively according to the identification information and intervals in which the first memory states are located that are resulted from the second to (P−1)th read operations, and determine second memory states corresponding to the first memory states; and perform a Pth read operation with the Pth stage read voltage respectively, perform the second program operation on the memory cell in the first memory state in the (P+1)th interval according to the identification information and an interval in which the first memory state is located that is resulted from the Pth read operation, and determine the second memory state corresponding to the first memory state.

In an example, as shown in FIG. 6, the number of storage bits in the memory cell 611 may include 4 storage bits, the 4 storage bits correspond to 16 memory states, and the values of the identification information comprise 4 data states.

The memory controller 51 is configured to determine the target interval in which the first memory state of the memory cell 611 after the first program operation is located with the 6-stage read voltages. The first stage read voltage is a median between the first and fourth ones of the first threshold voltage distributions, the second stage read voltage is a median between the third and sixth ones of the first threshold voltage distributions, the third stage read voltage is a median between the fifth and eighth ones of the first threshold voltage distributions, the fourth stage read voltage is a median between the seventh and tenth ones of the first threshold voltage distributions, the fifth stage read voltage is a median between the ninth and twelfth ones of the first threshold voltage distributions, and the sixth stage read voltage is a median between the eleventh and fourteenth ones of the first threshold voltage distributions.

If the target interval in which the first memory state after the first program operation is located is the first interval and a value of the identification information is a first data state (e.g., "0") in the 4 data states, the first memory state is located in a first one in the first threshold voltage distributions. The second program operation is performed on the memory cell 611, such that the first memory state located in a first one in the first threshold voltage distributions is programmed to the second memory state.

If the target interval in which the first memory state after the first program operation is located is the first interval and a value of the identification information is a second data state (e.g., "1") in the 4 data states, the first memory state is located in the second one in the first threshold voltage distributions. The second program operation is performed on the memory cell 611, such that the first memory state located in the second one in the first threshold voltage distributions is programmed to the second memory state.

If the target interval in which the first memory state after the first program operation is located is the first interval and a value of the identification information is a third data state (e.g., "2") in the 4 data states, the first memory state is located in the third one in the first threshold voltage distributions. The second program operation is performed on the memory cell 611, such that the first memory state located in the third one in the first threshold voltage distributions is programmed to the second memory state.

If the target interval in which the first memory state after the first program operation is located is a second interval and a value of the identification information is a fourth data state (e.g., "3") in the 4 data states, the first memory state is located in the fourth one in the first threshold voltage distributions. The second program operation is performed on the memory cell 611, such that the first memory state located in the fourth one in the first threshold voltage distributions is programmed to the second memory state.

If the target interval in which the first memory state after the first program operation is located is the second interval and a value of the identification information is the first data state (e.g., "0") in the 4 data states, the first memory state is located in the fifth one in the first threshold voltage distributions. The second program operation is performed on the memory cell 611, such that the first memory state located in the fifth one in the first threshold voltage distributions is programmed to the second memory state.

If the target interval in which the first memory state after the first program operation is located is a third interval and a value of the identification information is the second data state (e.g., "1") in the 4 data states, the first memory state is located in the sixth one in the first threshold voltage distributions. The second program operation is performed on the memory cell 611, such that the first memory state located in the sixth one in the first threshold voltage distributions is programmed to the second memory state.

If the target interval in which the first memory state after the first program operation is located is the third interval and a value of the identification information is the third data state (e.g., "2") in the 4 data states, the first memory state is located in the seventh one in the first threshold voltage distributions. The second program operation is performed on the memory cell 611, such that the first memory state located in the seventh one in the first threshold voltage distributions is programmed to the second memory state.

If the target interval in which the first memory state after the first program operation is located is a fourth interval and a value of the identification information is the fourth data state (e.g., "3") in the 4 data states, the first memory state is located in the eighth one in the first threshold voltage distributions. The second program operation is performed on the memory cell 611, such that the first memory state located in the eighth one in the first threshold voltage distributions is programmed to the second memory state.

If the target interval in which the first memory state after the first program operation is located is the fourth interval and a value of the identification information is the first data state (e.g., "0") in the 4 data states, the first memory state is located in the ninth one in the first threshold voltage distributions. The second program operation is performed on the memory cell 611, such that the first memory state located in the ninth one in the first threshold voltage distributions is programmed to the second memory state.

If the target interval in which the first memory state after the first program operation is located is a fifth interval and a value of the identification information is the second data state (e.g., "1") in the 4 data states, the first memory state is located in the tenth one in the first threshold voltage distributions. The second program operation is performed on the memory cell 611, such that the first memory state located in the tenth one in the first threshold voltage distributions is programmed to the second memory state.

If the target interval in which the first memory state after the first program operation is located is the fifth interval and a value of the identification information is the third data state (e.g., "2") in the 4 data states, the first memory state is located in the eleventh one in the first threshold voltage distributions. The second program operation is performed on the memory cell 611, such that the first memory state located in the eleventh one in the first threshold voltage distributions is programmed to the second memory state.

If the target interval in which the first memory state after the first program operation is located is a sixth interval and a value of the identification information is the fourth data state (e.g., "3") in the 4 data states, the first memory state is located in the twelfth one in the first threshold voltage distributions. The second program operation is performed on the memory cell 611, such that the first memory state located in the twelfth one in the first threshold voltage distributions is programmed to the second memory state.

If the target interval in which the first memory state after the first program operation is located is the sixth interval and a value of the identification information is the first data state (e.g., "0") in the 6 data states, the first memory state is located in the thirteenth one in the first threshold voltage distributions. The second program operation is performed on the memory cell 611, such that the first memory state located in the thirteenth one in the first threshold voltage distributions is programmed to the second memory state.

If the target interval in which the first memory state after the first program operation is located is a seventh interval and a value of the identification information is the second data state (e.g., "1") in the 4 data states, the first memory state is located in the fourteenth one in the first threshold voltage distributions. The second program operation is performed on the memory cell 611, such that the first memory state located in the fourteenth one in the first threshold voltage distributions is programmed to the second memory state.

If the target interval in which the first memory state after the first program operation is located is the seventh interval and a value of the identification information is the third data state (e.g., "2") in the 4 data states, the first memory state is located in the fifteenth one in the first threshold voltage distributions. The second program operation is performed on the memory cell 611, such that the first memory state located in the fifteenth one in the first threshold voltage distributions is programmed to the second memory state.

If the target interval in which the first memory state after the first program operation is located is the seventh interval and a value of the identification information is the fourth data state (e.g., "3") in the 4 data states, the first memory state is located in the sixteenth one in the first threshold voltage distributions. The second program operation is performed on the memory cell 611, such that the first memory state located in the sixteenth one in the first threshold voltage distributions is programmed to the second memory state.

In some examples, a numbers of the first threshold voltage distributions included in each interval are the same or different. Some of the first threshold voltage distributions have ranges spanning across both sides of one stage read voltage.

In an example, as shown in FIG. 6, the first interval may include three first threshold voltage distributions, each of intervals from the second interval to the sixth interval comprise two first threshold voltage distributions, and the seventh interval may include three first threshold voltage distributions. Due to a large range of the first threshold voltage distribution, the adjacent two or three ones of first threshold voltage distributions may have spread region values. Therefore, during the determination of one stage read voltage, some of the first threshold voltage distributions have ranges spanning across both sides of the one stage read voltage.

On that basis, the identification information of the first threshold voltage distributions disposed in the same region are different. Moreover, identification information corresponding to a first threshold voltage distribution that spans across both sides of one stage read voltage is different from identification information corresponding to a first threshold voltage distribution that is present in only one interval. Therefore, when the target interval in which the memory state of the memory cell 611 is located is determined with the read voltage, the second program operation may be performed according to the first threshold voltage distribution and the identification information, thereby acquiring the second memory state.

Figure 7:
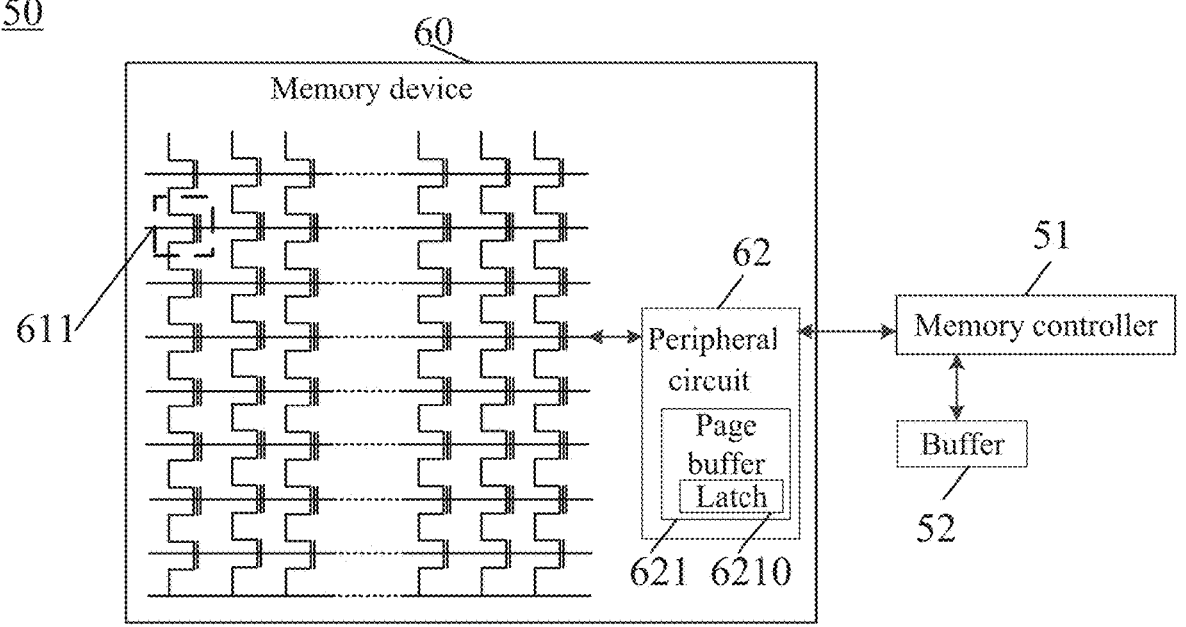
FIG. 7 is a schematic structural diagram III of a memory system provided by an example of the present disclosure.
Figure 8:
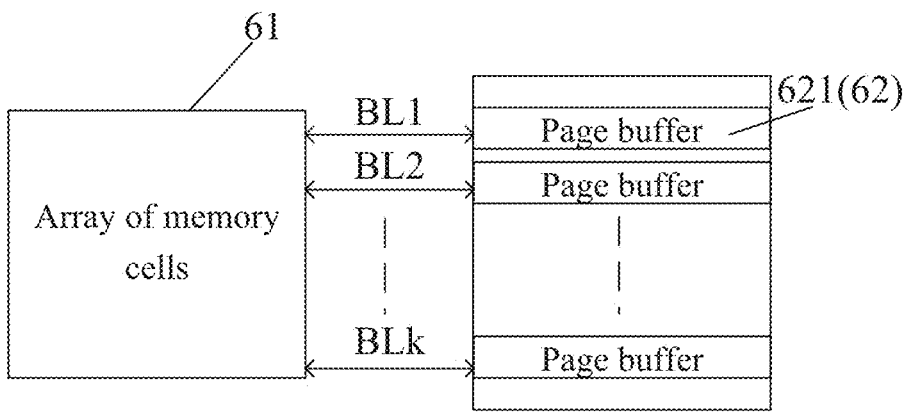
FIG. 8 is a schematic structural diagram of a memory device comprising a group of page buffers provided by an example of the present disclosure.

As shown in FIG. 7, in some examples, the memory device 60 further may include peripheral circuit 62, and the peripheral circuit 62 may include a page buffer 621. Furthermore, as shown in FIG. 8, the peripheral circuit 62 may comprise a group of page buffers consisting of a plurality of page buffers 621. The group of page buffers may be coupled with an array of memory cells 61 via a plurality of bit lines (BL1 to BLk). One page buffer 621 is coupled with the array of memory cells 61 via one bit line. For example, as shown in FIG. 8, the plurality of page buffers 621 may be coupled with the array of memory cells 61 via the respective bit lines BL1 to BLk, respectively.

In an example, as shown in FIG. 7, the page buffer 621 may include a plurality of latches 6210. In an example, the latch 6210 in the page buffer 621 in the memory cell 611 may include a Sense Latch (S Latch), a Low Voltage Latch (LVT Latch), four Data Latches (D Latch), and a Cache Latch (C Latch).

The sense latch S Latch may be configured to store inhibition information and verification information from a verify operation. The low voltage latch LVT Latch may be configured to store the inhibition information and adjusted verification information from a verify operation. The data latch D Latch may be configured to latch data of a specified page of the memory cell. The cache latch C Latch is configured to perform data exchange with the outside, for example, external data is first transmitted to the cache latch C Latch, and then transmitted to the sense latch S Latch through the cache latch C Latch. For another example, data in the sense latch S Latch is transmitted to the cache latch C Latch, and then transmitted to the outside through the cache latch C Latch. The outside may be the memory controller 31 or the host 20, etc. For still another example, the cache latch C Latch may be further used for other functions, e.g., for temporarily storing the verification information. The present disclosure does not impose any limitations on the type and number of the latches 6210 in the page buffer 621, which may be set according to actual needs.

Figure 9:
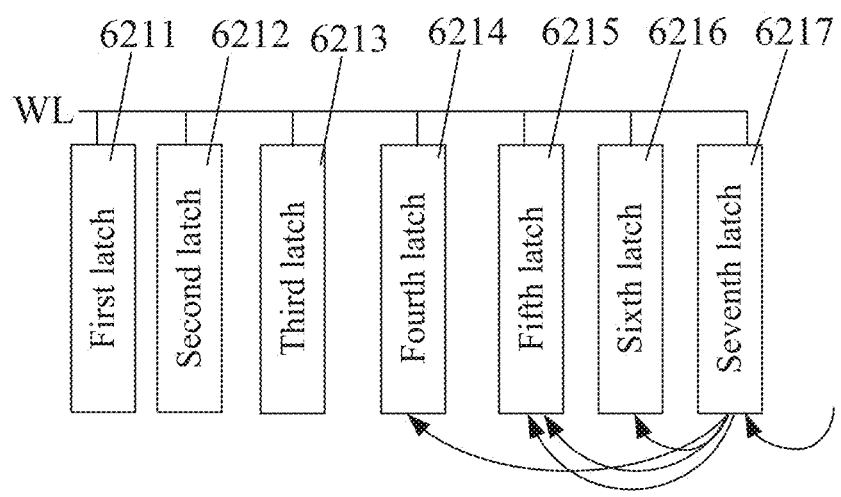
FIG. 9 is a schematic structural diagram of a page buffer comprising a latch provided by an example of the present disclosure.

As shown in FIG. 9, the memory controller 51 is configured to: store the interval in which the first memory state is located that is resulted from each read operation in a first latch 6211 among the plurality of latches 6210, and store the identification information in a second latch 6212 and a third latch 6213 among the plurality of latches 6210; and store four bits of data in the first memory state to be programmed in the second program operation in a fourth latch 6214 to a seventh latch 6217 among the plurality of latches 6210 according to data in the first latch 6211, the second latch 6212, and the third latch 6213.

In an example, with continued reference to FIG. 9, the memory type of the memory cell 611 is the QLC, with 4 storage bits. For example, the memory cell 611 stores data of four pages, including a Lower Page (LP), a Middle Page (MP), an Upper Page1 (UP1), and an Upper Page2 (UP2). The cache latch in the memory cell 611 on which a current read operation is performed may be configured to store data of the LP. Then after the cache latch transmits the data of the LP to a first data latch, the cache latch may be configured to store data of the MP. Then after the cache latch transmits the data of the MP to a second data latch, the cache latch may be configured to store data of the UP1. Further then after the cache latch transmits the data of the UP1 to a third data latch, the cache latch may be configured to store data of the UP2.

The memory controller 51 stores the interval (e.g., the plurality of intervals resulting from the division by the read voltages) in which the first memory state is located that is resulted from each read operation in the first latch 6211 (e.g., the sense latch).

The identification information that represents the second memory state based on the first memory state is stored in the second latch 6212 (e.g., the low voltage latch) and the third latch 6213 (e.g., the low voltage latch).

The four bits of data (e.g., the data of the LP, MP, UP1 and UP2) of the first memory state to be programmed in the second program operation are stored in the fourth latch 6214 to the seventh latch 6217 (e.g., the four data latches) according to the data in the first latch 6211, the second latch 6212, and the third latch 6213.

As such, some logical operations may be performed, e.g., determining the target interval and the second memory state of the memory cell 611 with the identification information and the first memory state.

In addition, a timing of the cache latch for data release may be set to allow the first latch 6211 to the fourth latch 6212 to acquire more memory states of the memory cell 611, thereby increasing a data amount of the subsequent data recovery.

It is to be noted that the memory controller 51 in the above example employs seven latches during the read operations. a number of the latches 6210 of the memory cell 611 may also be less than seven in case that the amount of stored data is small. For example, if the amount of stored data is small, the amount of the corresponding identification information is also small, and therefore the identification information may be stored in one latch 6210.

Furthermore, based on the data storage method adopted in the examples of the present disclosure, a number of data bits that can be stored by the latches 6210 may vary depending on different memory types of the memory cell 611. For example, the memory type of the memory cell 611 of the examples of the present disclosure is the QLC, where the first latch 6211 stores the data in the first memory state (for example, the QLC has a 4-bit first memory state); the second latch 6212 and the third latch 6213 store identification information for all data (for example, one type of identification information correspond to one bit, four types of identification information comprise four bits, and the identification information corresponding to all the first memory states comprise more bits), and the amount of the identification information stored respectively in the second latch 6212 and the third latch 6213 may be selected and set as needed; the fourth latch 6214 to the seventh latch 6217 each store one bit of data respectively. As can be seen, the numbers of data bits stored in different latches 6210 may be different or may be the same. The fourth latch 6214 to the seventh latch 6217 store the same number of data bits; the first latch 6211 and the second latch 6212 (or the third latch 6213) store different numbers of data bits. The examples of the present disclosure do not impose any limitations on the number of the latches 6210 and the amount of data stored in the latches 6210, as long as a principle of a data transmission method is met.

As shown in FIG. 10, examples of the present disclosure further provide a method of operating the memory system 50. The operation method may include S100 and S200.

S100: The memory cell 611 in the memory device 60 of the memory system 50 is programmed to the first memory state after the first program operation is performed.

In an example, the first program operation includes the coarse program operation. The programmed state of the memory cell 611 is the first memory state after the coarse program operation is performed on the memory cell 611 in the memory device 60.

S100 further may include S110: storing the identification information in the buffer 52 of the memory system 50. The identification information is in one-to-one correspondence with the first memory state, and the correspondence between the identification information and the first memory state is unique based on the target interval in which the first memory state is located.

S200: In response to the powering up again after the power down during the second program operation, the second memory state corresponding to the second program operation is determined according to the identification information and the data programmed after the first program operation. The identification information is to represent the second memory state corresponding to the second program operation.

The data in the first memory state is programmed to the second memory state after the second program operation is performed. The "powering up again after the power down during the second program operation" refers to the second program operation is re-executed after the power down occurs with the second program operation being not completed. The memory controller 51 controls the memory device 60 to reperform the second program operation, such that the memory cell 611 is programmed to the second memory state.

In an example, after the power down occurs with the second program operation being not completed, the powering up again requires reperforming the second program operation on the memory cell 611 in the first memory state. The second memory state is determined according to the first memory state and the identification information. The threshold voltage distribution width of the first state memory is greater than the threshold voltage distribution width of the second memory state. As such, the acquired data of the memory cell 611 of the second memory state can be recovered to data before the power down, achieving a good effect of data recovery. Moreover, the present disclosure adopts the identification information to make a value of the threshold voltage distribution of the memory cell 611 more accurate, and compared with a way of performing the data recovery with the first memory state alone, the examples of the present disclosure increase the accuracy of the data recovery.

Figure 11:
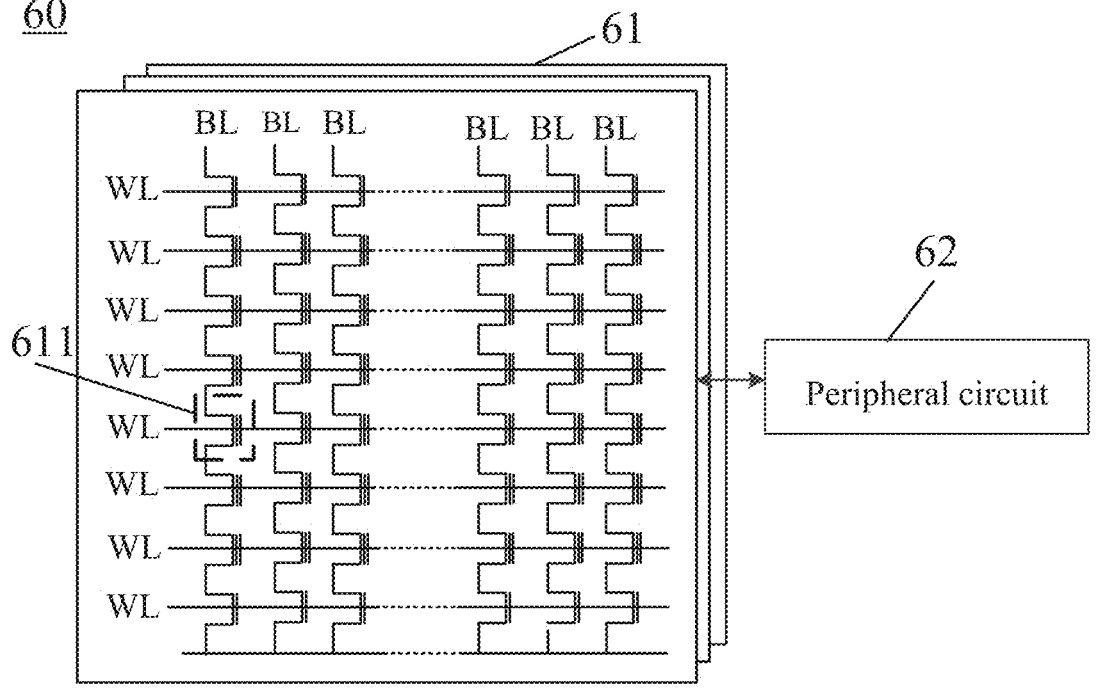
FIG. 11 is a schematic structural diagram I of a memory device provided by an example of the present disclosure.
Figure 12:
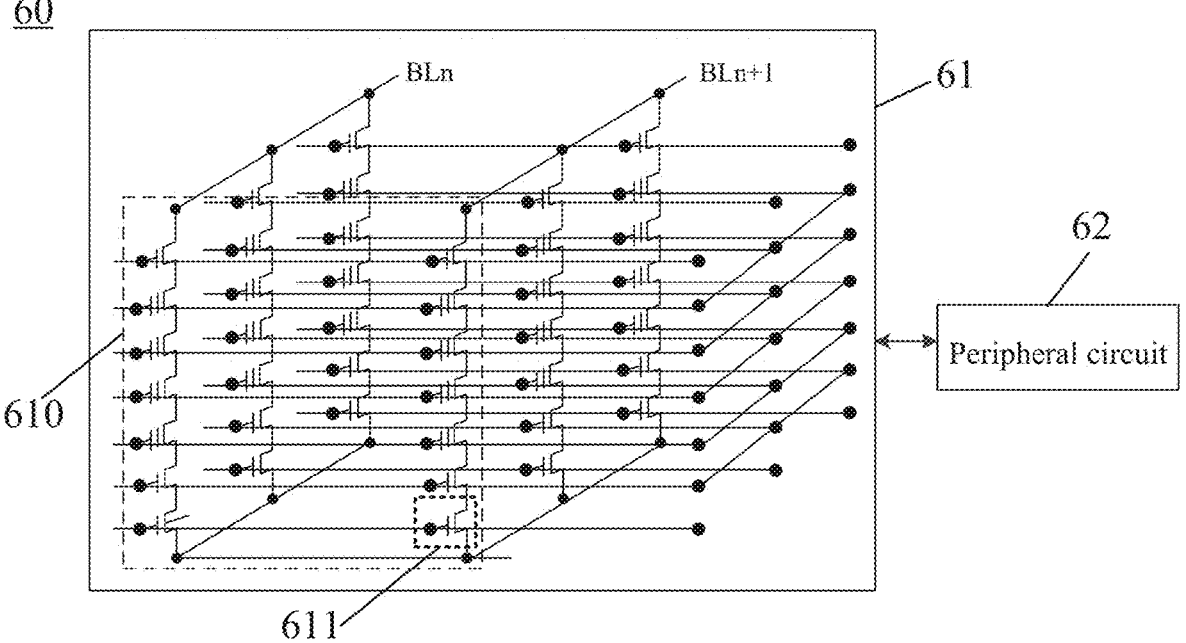
FIG. 12 is a schematic structural diagram II of a memory device provided by an example of the present disclosure.
Figure 13:
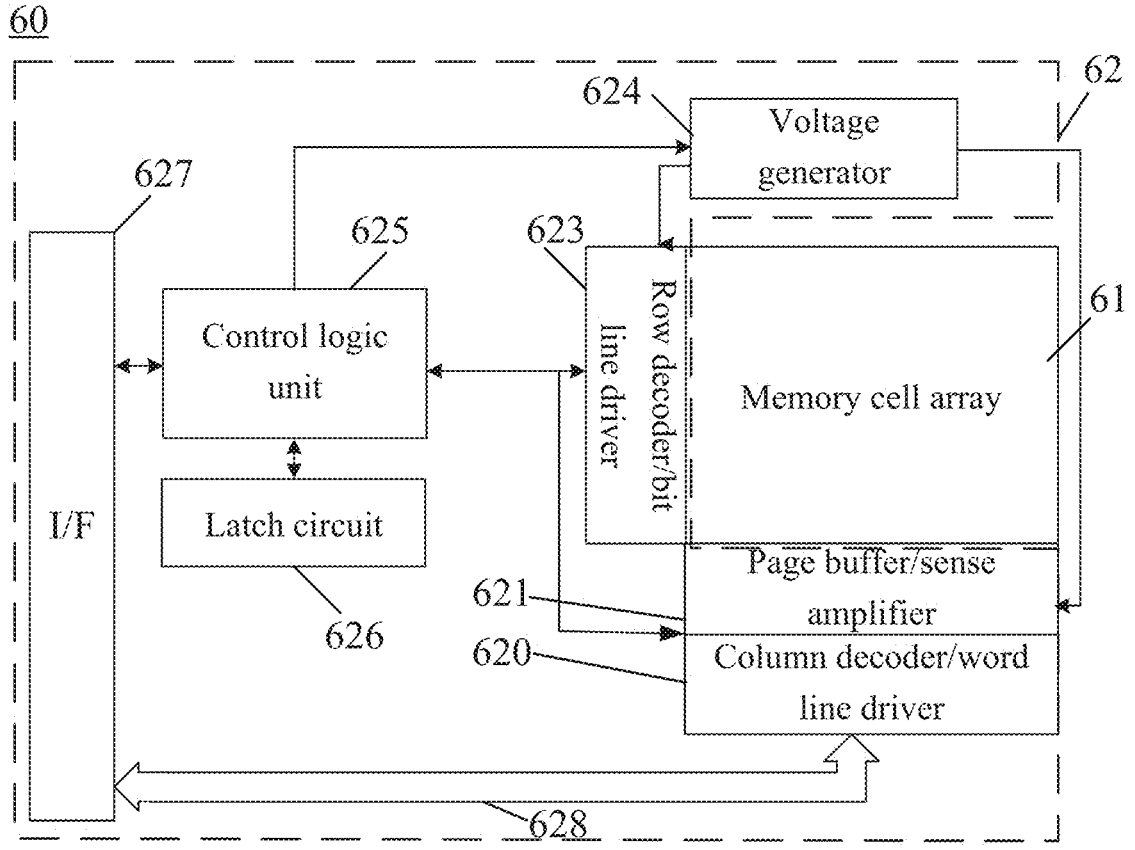
FIG. 13 is a schematic structural diagram III of a memory device provided by an example of the present disclosure.

In addition to the above memory system 50 and the operation method thereof, In order to solve the above problems, as shown in FIGS. 11-13, examples of the present disclosure further provide the memory device 60, which may also achieve the storage of more data and effective data recovery based on the stored data, thereby improving the data recovery capability of the memory device 60 and user experience.

In some examples, as shown in FIG. 11, the memory device 60 may comprise circuitries such as the array of memory cells 61 and the peripheral circuit 62 coupled to the array of memory cells 61, etc.

The array of memory cells 61 is coupled with a plurality of bit lines BLs. In an example, the array of memory cells 61 may be a NAND flash memory cell array. For example, the array of memory cells 61 is a circuitry disposed in the form of a NAND memory string array arrangement. Each NAND memory string extends vertically on a substrate. In an example, each NAND memory string may comprise a plurality of memory cells 611 that are coupled in series and stacked vertically. Each memory cell 611 performs signal transmission in a state of holding a consecutive and analog value (such as a voltage or charge). The analog value of the memory cell 611 depends on a number of electrons trapped in a region of the memory cell 611.

In an example, each memory cell 611 in the array of memory cells 61 may be either a floating gate type memory cell that includes a floating gate transistor, or a charge trap type memory cell that includes a charge trap transistor. The present disclosure do not impose limitations thereto.

In some examples, the memory type of the memory cell 611 includes any one of the SLC, MLC, TLC, and QLC, etc.

In an example, each memory cell 611 of the SLC may store one bit of data and has two possible memory states, including a first memory state and a second memory state. The first memory state (e.g., "0") corresponds to a first threshold voltage range, and the second memory state (e.g., "1") corresponds to a second threshold voltage range. The second memory state (e.g., "1") serves as an erase state, and the first memory state (e.g., "0") serves as a program state.

In another example, each memory cell of the MLC may store two bits of data and has four possible memory states, including a first memory state, a second memory state, a third memory state, and a fourth memory state. The first memory state (e.g., "11") corresponds to a first threshold voltage range, the second memory state (e.g., "01") corresponds to a second threshold voltage range, the third memory state (e.g., "10") corresponds to a third threshold voltage range, and the fourth memory state (e.g., "00") corresponds to a fourth threshold voltage range. The fourth memory state (e.g., "00") serves as an erase state, and the first memory state (e.g., "11"), the second memory state (e.g., "01") and the third memory state (e.g., "10") serve as program states.

Similarly, each memory cell of the TLC may store three bits of data and has eight possible memory states. The eight memory states correspond to eight threshold voltage ranges respectively, and are no longer repeated here. One of the eight memory states serves as an erase state (e.g., "111"), and the other seven memory states serve as program states. Furthermore, each memory cell of the QLC may store four bits of data and has sixteen possible memory states. The sixteen memory states correspond to sixteen threshold voltage ranges respectively, and are no longer repeated here. One of the sixteen memory states serves as an erase state (e.g., "1111"), and the other fifteen memory states serve as program states.

With continued reference to FIG. 11, the peripheral circuit 62 may be coupled to the array of memory cells 61 with a Bit Line (BL), a Word Line (WL), a Source Line, a Source Select Gate (SSG), and a Drain Select Gate (DSG). The peripheral circuit 62 is configured to implement logical operations (such as a program, read, or write operation) of the array of memory cells 61 by applying a voltage signal and/or a current signal to each target memory cell 611 and sensing a voltage signal and/or a current signal from each target memory cell 611 via the bit line BL, the word line WL, the source line SL, the source select gate SSG, or the drain select gate DSG, etc.

In an example, the peripheral circuit 62 may include various types of circuitries formed using Metal-Oxide-Semiconductor (MOS) transistors. For example, as shown in FIG. 12, the peripheral circuit 62 may comprise various circuitries such as a row decoder/word line driver 620, a page buffer (PB)/sense amplifier 621, a column decoder/bit line driver 623, a voltage generator 624, a control logic 625, a latch circuit 626, an interface 627, and a data bus 628, etc.

Based on the above example structures of the array of memory cells 61 and the peripheral circuit 62, in the case of the abnormal power down of the memory device 60, in one example, during a program operation performed by the memory device 60 on the memory cell 611, the memory cell 6111 is programmed to the first memory state after the first program operation is performed, and the data in the first memory state is programmed to the second memory state after the second program operation is performed. The threshold voltage distribution width of the first state memory is greater than the threshold voltage distribution width of the second memory state.

The peripheral circuit 62 is configured to: in response to the powering up again after the power down during the second program operation, determine the second memory state corresponding to the second program operation according to identification information and the data in the first memory state after the first program operation, wherein the identification information is to represent the second memory state corresponding to the second program operation; and reperform the second program operation, such that the memory cell is programmed to the second memory state.

In an example, the first program operation includes the coarse program operation, and the second program operation includes the fine program operation.

After the peripheral circuit 62 controls the memory device to perform the first program operation, the memory cell 611 is programmed to the first memory state. The first memory state refers to the distribution width of the threshold voltages of the memory cell 611 being a large range, and in the case of the abnormal power down of the memory device, a recovery of original data may not be implemented accurately according to the first memory state alone. Accordingly, the peripheral circuit 62 makes the range of the threshold voltage distribution of the memory cell 611 more accurate according to the identification information. The memory device 60 employs the second program operation to determine the second memory state of the memory cell 611 with the first memory state and the identification information. On that basis, in the case of the abnormal power down of the memory device 60, the memory device 60 may acquire the original memory state of the memory cell 611 with the memory cell 611 in the second memory state. In turn, after the reprogramming being performed under the control of the peripheral circuit 62, the data of the original memory state is recovered to acquire the memory state of the memory cell 611 before the abnormal power down, increasing the accuracy of the data recovery, and thereby improving the performance of the memory device 60 and the user experience.

In some examples, as shown in FIG. 11, the array of memory cells 61 may include a plurality of word lines WLs, with one of the word lines WLs being coupled with a plurality of memory cells 611.

The peripheral circuit 62 is configured to: perform the first program operation and the second program operation sequentially on the memory cells 611 coupled with the spaced word lines WLs according to the sequence of physical locations of the plurality of word lines WLs. For the plurality of memory cells 611 coupled with the same word line WL, the second program operation is performed after the first program operation is performed.

In an example, with continued reference to FIG. 11, the plurality of word lines WLs comprise a Qth word line, a (Q+1)th word line, a (Q+2)th word line, and a (Q+3)th word line of which physical locations are disposed consecutively. Q is a natural number.

The peripheral circuit is configured to: perform the first program operation on the memory cells 611 coupled with the (Q+1)th word line; then perform the second program operation on the memory cells 611 coupled with the Qth word line; then perform the first program operation on the memory cells 611 coupled with the (Q+2)th word line; then perform the second program operation on the memory cells 611 coupled with the (Q+1)th word line; then perform the first program operation on the memory cells 611 coupled with the (Q+3)th word line; and then perform the second program operation on the memory cells 611 coupled with the (Q+2)th word line.

In some examples, the peripheral circuit 62 is configured to: generate the identification information for the second program operation that corresponds to the first memory state during the first program operation; and store the identification information.

In an example, as shown in FIG. 12, the array of memory cells 61 comprise a plurality of memory blocks 610. The peripheral circuit 62 is configured to store the identification information in a specified memory block 610 among the plurality of memory blocks 610.

Through division of the memory blocks 610, the storage efficiency of the identification information is improved, and a space occupied by the identification information is reduced, which facilitate an increase in the amount of data stored in the memory cell 611 of the first memory state, thereby increasing the data amount of the data recovery and improving the performance of the memory device 60 and the user experience.

It may be understood that the identification information is stored in one specified memory block 610, and the specified memory block 610 may be any memory block 610 with a preset address, so as to facilitate quick storage and filtering of the identification information according to the address of the specified memory block 610, thereby improving the efficiency of acquiring the identification information. In addition, in the case of a large amount of identification information, a plurality of specified memory blocks 610 may be set for the storage of the identification information. The present disclosure does not impose any limitations on a particular structure of the specified memory block 610.

In some examples, the number of storage bits of the memory cell 611 may include multiple storage bits, and the multiple storage bits correspond to a plurality of memory states.

The peripheral circuit 62 is configured to: generate the identification information sequentially according to a sequential order of the plurality of memory states.

In an example, the number of the storage bits in the memory cell 611 is related to a memory type. The memory type of the memory cell 611 is the MLC, with 2 storage bits and 22 memory states. For example, there are 4 memory states, including "00", "01", "10", and "11". The peripheral circuit 62 controls the memory device 60 to generate the identification information sequentially according to a sequential order of the 4 memory states. For example, identification information "0" corresponds to the memory state "00", identification information "1" corresponds to the memory state "01", identification information "2" corresponds to the memory state "10", and identification information "3" corresponds to the memory state "11".

In some examples, the number of storage bits in the memory cell 611 may include M storage bits, and the M storage bits correspond to $2^M$ memory states. The identification information may include N bits of data, and values of the identification information comprise $2^N$ data states. M and N are both positive integers.

The peripheral circuit 62 is configured to: generate the $2^N$ data states corresponding to the values of the identification information sequentially and cyclically according to the sequential order of the $2^M$ memory states.

In an example, as shown in FIG. 6, the memory type of the memory cell 611 is the QLC, with 4 storage bits and 24 memory states. For example, there are 16 memory states, including "1111", "1110", "0110", "0010", "0011", "0001", "0000", "0100", "1100", "1000", "1010", "1011", "1001", "1101", "0101", and "0111". The peripheral circuit 62 controls the memory device 60 to generate the identification information sequentially and cyclically according to a sequential order of the 16 memory states. For example, identification information corresponding to the memory state "1111" is "0", identification information corresponding to the memory state "1110" is "1", identification information corresponding to the memory state "0110" is "2", and identification information corresponding to the memory state "0010" is "3"; identification information corresponding to the memory state "0011" is "0", identification information corresponding to the memory state "0001" is "1", identification information corresponding to the memory state "0000" is "2", and identification information corresponding to the memory state "0100" is "3"; identification information corresponding to the memory state "1100" is "0", identification information corresponding to the memory state "1000" is "1", identification information corresponding to the memory state "1010" is "2", and identification information corresponding to the memory state "1011" is "3"; identification information corresponding to the memory state "1001" is "0", identification information corresponding to the memory state "1101" is "1", identification information corresponding to the memory state "0101" is "2", and identification information corresponding to the memory state "0111" is "3".

The $2^M$ memory states of the memory cell 611 comprise: $2^M$ first memory states after the first program operation being performed, wherein threshold voltage distributions of the first memory states are first threshold voltage distributions; and $2^M$ second memory states after the second program operation that correspond to the first memory states. Threshold voltage distributions of the second memory states are second threshold voltage distributions.

Each of the first threshold voltage distributions has a range wider than a range of a respective second threshold voltage distribution. Ranges of adjacent ones of the plurality of first threshold voltage distributions overlap.

That is, each first threshold voltage distribution has the range wider than the range of the respective second threshold voltage distribution, and the recovery of the original data of the memory cell 611 may not be implemented accurately according to the first memory state alone. Moreover, since the ranges of adjacent ones of the plurality of first threshold voltage distributions overlap, the data recovery performed according to the first memory state alone is prone to an error, causing an essential difference between recovered data and the original data. The examples of the present disclosure example may improve the accuracy of the data recovery by combining the identification information and the first memory state during the second program operation.

It is to be noted that the identification information may include N bits of data, and the value of N is related to the number of intervals into which the threshold voltage distributions of the memory cells 611 are divided, so as to avoid the presence of identification information for the same value in the same interval, in which case a threshold voltage range of the second memory state corresponding to the first memory state may not be determined according to the identification information. For example, if adjacent ones of two or more threshold voltage distributions overlap, at least two threshold voltage distributions that meet a condition may be read using the same read voltage value, in which case a threshold voltage range in which a memory state of the current memory cell 611 is located may not be determined during the subsequent data recovery. On that basis, N bits of identification information are required to distinguish between the threshold voltage distributions having an overlap range, so as to increase the accuracy of the data recovery.

In some examples, the peripheral circuit 62 is configured to: determine a target interval in which the memory cell is located after the first program operation with P-stage read voltages, wherein the P-stage read voltages divide the first to $(2^M)$th one in the first threshold voltage distributions into P+1 intervals, each of the P+1 intervals may include a plurality of consecutive first threshold voltage distributions, the different first threshold voltage distributions in each interval correspond to different values of the identification information, P is a positive integer; and reprogram the data in the first memory state in the second program operation according to a determined target interval and a value of the identification information, such that the memory cell 611 is programmed to the second memory state.

The P-stage read voltages comprise the first to Pth stage read voltages with gradually increasing voltage values. The P+1 intervals comprise the first to (P+1)th intervals.

It may be understood that the P-stage read voltages may realize that the threshold voltage distributions in one interval correspond to different pieces of identification information. As such, after the target interval in which the currently read first memory state of the memory cell 611 is located is determined, the second memory state can be determined directly according to the identification information, improving the efficiency and accuracy of the second program operation and increasing the accuracy of the data recovery.

The peripheral circuit 62 is configured to: perform a first read operation with the first stage read voltage, and determine the identification information and the interval in which the first memory state of the memory cell 611 is located after the first program operation, perform the second program operation on the memory cell 611 in the first memory state in the first interval, and determine the second memory state corresponding to the first memory state;

perform second to (P−1)th read operations with second to (P−1)th stage read voltages respectively, perform the second program operation on memory cells 611 in the first memory states in the second to Pth intervals respectively according to the identification information and intervals in which the first memory states are located that are resulted from the second to (P−1)th read operations, and determine second memory states corresponding to the first memory states; and perform a Pth read operation with the Pth stage read voltage respectively, perform the second program operation on the memory cell in the first memory state in the (P+1)th interval according to the identification information and an interval in which the first memory state is located that is resulted from the Pth read operation, and determine the second memory state corresponding to the first memory state.

In some examples, the number of storage bits in the memory cell 611 may include 4 storage bits, the 4 storage bits correspond to 16 memory states, and the values of the identification information comprise 4 data states.

The peripheral circuit 62 is configured to: determine the target interval in which the first memory state of the memory cell 611 after the first program operation is located with the 6-stage read voltages, the first stage read voltage is a median between the first and fourth ones of the first threshold voltage distributions, the second stage read voltage is a median between the third and sixth ones of the first threshold voltage distributions, the third stage read voltage is a median between the fifth and eighth ones of the first threshold voltage distributions, the fourth stage read voltage is a median between the seventh and tenth ones of the first threshold voltage distributions, the fifth stage read voltage is a median between the ninth and twelfth ones of the first threshold voltage distributions, and the sixth stage read voltage is a median between the eleventh and fourteenth ones of the first threshold voltage distributions, and if the target interval in which the first memory state after the first program operation is located is the first interval and a value of the identification information is a first data state in the 4 data states, the first memory state is located in a first one in the first threshold voltage distributions; and perform the second program operation on the memory cell, such that the first memory state located in a first one in the first threshold voltage distributions is programmed to the second memory state.

In some examples, the numbers of the first threshold voltage distributions included in each interval are the same or different. Some of the first threshold voltage distributions have ranges spanning across both sides of one stage read voltage.

In an example, as shown in FIG. 6, the first interval may include three first threshold voltage distributions, each of intervals from the second interval to the sixth interval comprise two first threshold voltage distributions, and the seventh interval may include three first threshold voltage distributions. Due to a large range of the first threshold voltage distribution, the adjacent ones of two or three first threshold voltage distributions may have spread region values. Therefore, during the determination of one stage read voltage, some of the first threshold voltage distributions have ranges spanning across both sides of the one stage read voltage.

On that basis, the identification information of the first threshold voltage distributions disposed in the same region are different. Moreover, identification information corresponding to a first threshold voltage distribution that spans across both sides of one stage read voltage is different from identification information corresponding to a first threshold voltage distribution that is present in only one interval. Therefore, when the target interval in which the memory state of the memory cell 611 is located is determined with the read voltage, the second program operation may be performed according to the first threshold voltage distribution and the identification information, thereby acquiring the second memory state.

In some examples, as shown in FIG. 9, the peripheral circuit 62 may include a page buffer 621, the page buffer 621 comprising a plurality of latches 6210.

The peripheral circuit 62 is configured to: store the interval in which the first memory state is located that is resulted from each read operation in a first latch 6211 among the plurality of latches 6210, and store the identification information in a second latch 6212 and a third latch 6213 among the plurality of latches 6210; and store four bits of data in the first memory state to be programmed in the second program operation in a fourth latch 6214 to a seventh latch 6217 among the plurality of latches 6210 according to data in the first latch 6211, the second latch 6212, and the third latch 6213.

In an example, with continued reference to FIG. 9, the first latch 6211 is a cache latch that may store the first memory state of the memory cell 611 under the current read operation. The second latch 6212 and the third latch 6213 are data latches storing the identification information that represents the second memory state based on the first memory state. The fourth latch 6214, the fifth latch 6215, the sixth latch 6216 and the seventh latch 6217 are low voltage latches, which may perform some logical operations, e.g., determining the target interval and the second memory state of the memory cell 611 with the identification information and the first memory state.

In the memory cell 611 (e.g., the QLC memory type, comprising the LP, MP, UP1 and UP2) on which a current read operation is performed, the peripheral circuit 62 stores the interval (e.g., the plurality of intervals resulting from the division by the read voltages) in which the first memory state is located that is resulted from each read operation in the first latch 6211 (e.g., the sense latch).

The identification information that represents the second memory state based on the first memory state is stored in the second latch 6212 (e.g., the low voltage latch) and the third latch 6213 (e.g., the low voltage latch).

The four bits of data (e.g., the data of the LP, MP, UP1 and UP2) of the first memory state to be programmed in the second program operation are stored in the fourth latch 6214 to the seventh latch 6217 (e.g., the data latches) according to the data in the first latch 6211, the second latch 6212, and the third latch 6213.

As such, some logical operations may be performed, e.g., determining the target interval and the second memory state of the memory cell 611 based on the identification information and the first memory state.

In addition, a data release timing of the cache latch may be set to allow the first latch 6211 to the fourth latch 6212 to acquire more memory states of the memory cell 611, thereby increasing a data amount of the subsequent data recovery.

Figure 14:
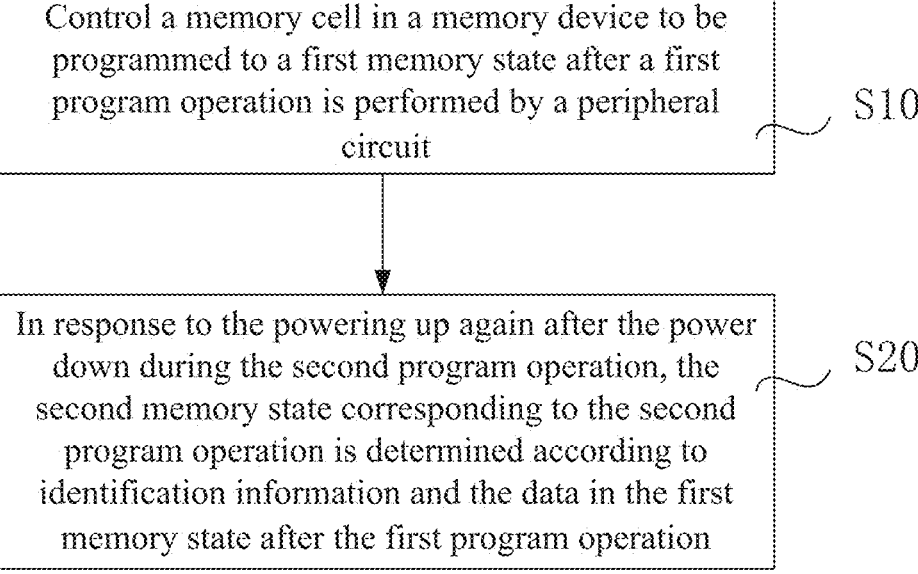
FIG. 14 is a flow diagram of a method of operating a memory device provided by examples of the present disclosure.

As shown in FIG. 14, examples of the present disclosure further provide a method of operating the memory device 60. The operation method may include S10 and S20.

S10: The memory cell 611 in the memory device 60 is programmed to the first memory state after the first program operation is performed.

In an example, the first program operation includes the coarse program operation. The memory cell 611 is programmed to the first memory state after the coarse program operation is performed on the memory cell 611 in the memory device 60.

S10 further may include S11: storing the identification information in the memory device 60. The identification information is in one-to-one correspondence with the first memory state, and the correspondence between the identification information and the first memory state is unique based on the target interval in which the first memory state is located.

S20: In response to the powering up again after the power down during the second program operation, the second memory state corresponding to the second program operation is determined according to identification information and the data in the first memory state after the first program operation. The identification information is to represent the second memory state corresponding to the second program operation.

The data in the first memory state is programmed to the second memory state after the second program operation. The "powering up again after the power down during the second program operation" means that the second program operation is re-executed after the power down occurs with the second program operation being not completed. The peripheral circuit 62 controls the memory device 60 to reperform the second program operation, such that the memory cell 611 is programmed to the second memory state.

In an example, after the power down occurs with the second program operation being not completed, the powering up again requires reperforming the second program operation on the memory cell 611 in the first memory state. The second memory state is determined according to the first memory state and the identification information. The threshold voltage distribution width of the first state memory is greater than the threshold voltage distribution width of the second memory state. As such, the acquired data of the memory cell 611 of the second memory state can be recovered to data before the power down, achieving a good effect of data recovery. Moreover, the present disclosure adopts the identification information to make a value of the threshold voltage distribution of the memory cell 611 more accurate, and compared with a way of performing the data recovery with the first memory state alone, the examples of the present disclosure increase the accuracy of the data recovery.

S20 further may include S21: The memory device 60 reads the second memory state of the memory cell 611 that is acquired after the recovery, and proceeds to other operations (e.g., a program or erase operation).

Based on the memory device 60 and the operation method thereof and the memory system 50 and the operation method thereof provided in the above contents, the present disclosure provides the storage medium 40 which has executable instructions stored thereon, wherein the executable instructions, when executed, may implement operations of the method of operating the memory device 60 or the memory system 50 provided by any of the above examples.

The above descriptions are merely implementations of the present disclosure, and the protection scope of the present disclosure is not limited thereto. Any variation or replacement that may be readily figured out by a person skilled in the art within the technical scope disclosed by the present disclosure shall fall within the protection scope of the present disclosure. Therefore, the protection scope of the present disclosure shall be defined by the protection scope of the claims.

What is claimed is:

1. A memory device, comprising:

an array of memory cells comprising memory cells, wherein a memory cell of the memory cells is programmed to a first memory state after a first program operation is performed, data in the first memory state is programmed to a second memory state after a second program operation is performed, and a distribution width of threshold voltages of the first memory state is greater than a distribution width of threshold voltages of the second memory state; and a peripheral circuit coupled with the array of memory cells, wherein the peripheral circuit is configured to:

in response to powering up again after a power down during the second program operation, determine the second memory state corresponding to the second program operation according to identification information and the data in the first memory state after the first program operation, wherein the identification information is to represent the second memory state corresponding to the second program operation; and reperform the second program operation, such that the memory cell is programmed to the second memory state.

2. The memory device of claim 1, wherein the peripheral circuit is configured to:

generate identification information for the second program operation that corresponds to the first memory state during the first program operation; and store the identification information.

3. The memory device of claim 2, wherein the array of memory cells comprises memory blocks, and the peripheral circuit is configured to:

store the identification information in a specified memory block among the memory blocks.

4. The memory device of claim 2, wherein a number of storage bits of the memory cell comprises multiple storage bits, and the multiple storage bits correspond to memory states;

the peripheral circuit is configured to:

generate the identification information sequentially according to a sequential order of the memory states.

5. The memory device of claim 4, wherein the number of storage bits in the memory cell comprises M storage bits, and the M storage bits correspond to $2^M$ memory states; the identification information comprises N bits of data, and values of the identification information comprise $2^N$ data states; M and N are both positive integers;

the peripheral circuit is configured to:

generate $2^N$ data states corresponding to the values of the identification information sequentially and cyclically according to the sequential order of the $2^M$ memory states.

6. The memory device of claim 5, wherein the $2^M$ memory states of the memory cell comprise:

$2^M$ first memory states after the first program operation being performed, wherein threshold voltage distributions of the first memory states are first threshold voltage distributions; and $2^M$ second memory states after the second program operation being performed that correspond to the first memory states, wherein threshold voltage distributions of the second memory states are second threshold voltage distributions;

wherein each of the first threshold voltage distributions has a range wider than a range of a respective second threshold voltage distribution; ranges of adjacent ones of the first threshold voltage distributions overlap.

7. The memory device of claim 6, wherein the peripheral circuit is configured to:

determine a target interval in which the memory cell is located after the first program operation with P-stage read voltages, wherein the P-stage read voltages divide a first to a $(2^M)$th ones of the first threshold voltage distributions into P+1 intervals, each of the P+1 intervals comprises consecutive first threshold voltage distributions, a different first threshold voltage distribution in each interval correspond to different values of the identification information, and P is a positive integer; and reprogram the data in the first memory state in the second program operation according to a determined target interval and a value of the identification information, such that the memory cell is programmed to the second memory state.

8. The memory device of claim 7, wherein numbers of the first threshold voltage distributions included in each interval are the same or different; and some of the first threshold voltage distributions have ranges spanning across both sides of one stage read voltage.

9. The memory device of claim 7, wherein the P-stage read voltages comprise first to Pth stage read voltages with gradually increasing voltage values; the P+1 intervals comprise a first to a $(P+1)$th intervals; the peripheral circuit is configured to:

perform a first read operation with the first stage read voltage, and determine the identification information and the interval in which the first memory state of the memory cell is located after the first program operation, perform the second program operation on the memory cell in the first memory state in the first interval, and determine the second memory state corresponding to the first memory state;

perform second to $(P-1)$th read operations with second to $(P-1)$th stage read voltages respectively, perform the second program operation on memory cells in the first memory states in second to Pth intervals respectively according to the identification information and intervals in which the first memory states are located that are resulted from second to $(P-1)$th read operations, and determine second memory states corresponding to the first memory states; and perform a Pth read operation with Pth stage read voltage respectively, perform the second program operation on the memory cell in the first memory state in $(P+1)$th interval according to the identification information and an interval in which the first memory state is located that is resulted from the Pth read operation, and determine the second memory state corresponding to the first memory state.

10. The memory device of claim 9, wherein the number of storage bits in the memory cell comprises 4 storage bits, the 4 storage bits correspond to 16 memory states, and the values of the identification information comprise 4 data states; the peripheral circuit is configured to:

determine the target interval in which the first memory state of the memory cell after the first program operation is located with 6-stage read voltages, wherein a first stage read voltage is a median between the first and fourth ones of the first threshold voltage distributions, a second stage read voltage is a median between third and sixth ones of the first threshold voltage distributions, a third stage read voltage is a median between fifth and eighth ones of the first threshold voltage distributions, a fourth stage read voltage is a median between seventh and tenth ones of the first threshold voltage distributions, a fifth stage read voltage is a median between ninth and twelfth ones of the first threshold voltage distributions, and a sixth stage read voltage is a median between eleventh and fourteenth ones of the first threshold voltage distributions; and if the target interval in which the first memory state after the first program operation is located is the first interval and a value of the identification information is a first data state in the 4 data states, the first memory state is located in a first one in the first threshold voltage distributions; and perform the second program operation on the memory cell, such that the first memory state located in a first one in the first threshold voltage distributions is programmed to the second memory state.

11. The memory device of claim 10, wherein the peripheral circuit comprises a page buffer, the page buffer comprising latches; the peripheral circuit is configured to:

store the interval in which the first memory state is located that is resulted from each read operation in a first latch among the latches, and store the identification information in a second latch and a third latch among the latches; and store four bits of data in the first memory state to be programmed in the second program operation in fourth to seventh latches among the latches according to data in the first, second, and third latches.

12. The memory device of claim 1, wherein the array of memory cells comprises word lines, with one of the word lines being coupled with memory cells;

the peripheral circuit is configured to: perform the first program operation and the second program operation sequentially on the memory cells coupled with spaced word lines according to a sequence of physical locations of the word lines; wherein for the memory cells coupled with the same word line, the second program operation is performed after the first program operation is performed.

13. The memory device of claim 12, wherein the word lines comprise a Qth word line, a (Q+1)th word line, a (Q+2)th word line, and a (Q+3)th word line of which physical locations are disposed consecutively; Q is a natural number;

the peripheral circuit is configured to:

perform the first program operation on the memory cells coupled with (Q+1)th word line; then perform the second program operation on the memory cells coupled with the Qth word line; then perform the first program operation on the memory cells coupled with (Q+2)th word line; then perform the second program operation on the memory cells coupled with the (Q+1)th word line; then perform the first program operation on the memory cells coupled with (Q+3)th word line; and then perform the second program operation on the memory cells coupled with the (Q+2)th word line.

14. A method of operating a memory device, comprising:

in response to powering up again after a power down during a second program operation, determining a second memory state corresponding to the second program operation according to data in a first memory state after a first program operation and identification information, wherein the identification information is to represent the second memory state corresponding to the second program operation, a memory cell in the memory device is programmed to the first memory state after the first program operation is performed, and the data in the first memory state is programmed to the second memory state after the second program operation is performed; and reperforming the second program operation, such that the memory cell is programmed to the second memory state.

15. A memory system, comprising:

a memory device comprising memory cells, wherein a memory cell of the memory cells is programmed to a first memory state after a first program operation is performed, and data in the first memory state is programmed to a second memory state after a second program operation is performed; and a memory controller coupled with the memory device and configured to:

in response to powering up again after a power down during the second program operation, determine the second memory state corresponding to the second program operation according to identification information and the data in the first memory state after the first program operation, wherein the identification information is to represent the second memory state corresponding to the second program operation; and control the memory device to reperform the second program operation, such that the memory cell is programmed to the second memory state.

16. The memory system of claim 15, wherein the memory controller is configured to:

send an instruction for generating before the first program operation, wherein the instruction for generating instructs the memory device to generate the identification information for the second memory state of the second program operation that corresponds to the first memory state during the first program operation; and store the identification information fed back from the memory device after the first program operation.

17. The memory system of claim 16, further comprising a buffer, wherein the memory controller is configured to:

store the identification information in the memory device; or store the identification information in the buffer, and during a power down latency after the power down, dump the identification information stored in the buffer into the memory device; and read the identification information in the memory device back into the buffer after the powering up again.

18. The memory system of claim 16, wherein a number of storage bits in the memory cell comprises M storage bits, the M storage bits correspond to $2^M$ memory states, the identification information comprises N bits of data, and values of the identification information comprise $2^N$ data states; M and N are both positive integers;

the memory controller is configured to: control the memory device to generate the $2^N$ data states corresponding to the values of the identification information sequentially and cyclically according to the sequential order of the $2^M$ memory states.

19. The memory system of claim 18, wherein the $2^M$ memory states of the memory cell comprise:

$2^M$ first memory states after the first program operation being performed, with threshold voltage distributions of the first memory states being first threshold voltage distributions; and $2^M$ second memory states after the second program operation being performed that correspond to the first memory states, wherein threshold voltage distributions of the second memory states are second threshold voltage distributions;

wherein each of the first threshold voltage distributions has a range wider than a range of a respective second threshold voltage distribution; ranges of adjacent ones of the first threshold voltage distributions overlap.

20. The memory system of claim 19, wherein the memory controller is configured to:

determine a target interval in which the memory cell is located after the first program operation with P-stage read voltages, wherein the P-stage read voltages divide first to $(2^M)$th ones of the first threshold voltage distributions into P+1 intervals, each of the P+1 intervals comprises consecutive first threshold voltage distributions, different first threshold voltage distributions in each interval correspond to different values of the identification information, and P is a positive integer; and reprogram the data in the first memory state in the second program operation according to a determined target interval and a value of the identification information, such that the memory cell is programmed to the second memory state;

wherein numbers of the first threshold voltage distributions included in each interval are the same or different; and some of the first threshold voltage distributions have ranges spanning across both sides of one stage read voltage.

* * * * *